(12) United States Patent
Hayashi

(10) Patent No.: US 7,577,404 B2
(45) Date of Patent: *Aug. 18, 2009

(54) HIGH-FREQUENCY DEVICE, HIGH-FREQUENCY MODULE AND COMMUNICATIONS DEVICE COMPRISING THEM

(75) Inventor: Kenji Hayashi, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 429 days.

This patent is subject to a terminal disclaimer.

(21) Appl. No.: 11/425,048

(22) Filed: Jun. 19, 2006

(65) Prior Publication Data

US 2006/0223368 A1 Oct. 5, 2006

Related U.S. Application Data

(62) Division of application No. 10/662,386, filed on Sep. 16, 2003, now Pat. No. 7,076,216.

(30) Foreign Application Priority Data

Sep. 17, 2002 (JP) ............................. 2002-269855
Oct. 25, 2002 (JP) ............................. 2002-310874

(51) Int. Cl.
*H04B 1/44* (2006.01)

(52) U.S. Cl. ............................. 455/78; 455/73; 455/76; 455/83; 455/561; 455/562.1

(58) Field of Classification Search ................... 455/78, 455/73, 76, 83, 561, 562.1, 560, 82
See application file for complete search history.

(56) References Cited

U.S. PATENT DOCUMENTS

| | | | |
|---|---|---|---|
| 3,245,014 A | 4/1966 | Plutchok et al. | |
| 5,446,464 A | 8/1995 | Feldle | |
| 5,771,016 A | 6/1998 | Mullins et al. | |
| 6,006,111 A | 12/1999 | Rowland | |
| 6,043,779 A | 3/2000 | Lalezari et al. | |
| 6,853,243 B2 * | 2/2005 | Sekine et al. | ................. 330/51 |
| 6,961,368 B2 * | 11/2005 | Dent et al. | ................. 375/219 |
| 7,026,887 B2 * | 4/2006 | Watanabe et al. | ........... 333/126 |
| 7,076,216 B2 * | 7/2006 | Hayashi | ..................... 455/78 |
| 2005/0146392 A1 | 7/2005 | Karlsson et al. | |

FOREIGN PATENT DOCUMENTS

| | | | |
|---|---|---|---|
| EP | 0 837516 A2 | 4/1998 | |
| EP | 0 921642 A2 | 6/1999 | |

(Continued)

*Primary Examiner*—Sanh D Phu
(74) *Attorney, Agent, or Firm*—Sughrue Mion, PLLC

(57) ABSTRACT

A high-frequency module constituted by an integral laminate for handling a plurality of transmitting/receiving systems having different passbands comprises (a) a switch module part for branching higher-frequency signals and lower-frequency signals and switching connection to the transmitting systems and the receiving systems, (b) a high-frequency amplifying circuit module part, and (c) a phase-adjusting circuit disposed between the switch module part and the high-frequency amplifying circuit module part, wherein the phase matching between the switch module part and the high-frequency amplifying circuit module part via the phase-adjusting circuit is adjusted to conjugate matching in a fundamental frequency band, while it is adjusted in a nonconjugate matching range in n-th frequency bands, wherein n is an integer of 2 or more.

19 Claims, 16 Drawing Sheets

FOREIGN PATENT DOCUMENTS

| | | |
|---|---|---|
| EP | 0 837516 A3 | 5/2000 |
| EP | 0 998035 A2 | 5/2000 |
| EP | 1061662 A1 | 12/2000 |
| EP | 1223634 A2 | 7/2002 |
| JP | 2000-183612 | 6/2000 |
| JP | 2002-171137 | 6/2002 |

* cited by examiner (a), (c)

(b), (d)

(a) (c)

(b) (d)

Connection Reference Plane (Point)

Circuit Portion of High-Frequency
Amplifier Near Output Terminal

Circuit Portion of Antenna Switch
Near Transmission Terminal

HIGH-FREQUENCY DEVICE, HIGH-FREQUENCY MODULE AND COMMUNICATIONS DEVICE COMPRISING THEM

This is a divisional application of U.S. Ser. No. 10/662,386, filed Sep. 16, 2003 now U.S. Pat. No. 7,076,216.

FIELD OF THE INVENTION

The present invention relates to a wireless communications system connected to a common antenna for transmitting and receiving two or more signals having different frequencies, particularly to a multiband high-frequency device comprising both switch circuit and high-frequency amplifying circuit, a multiband high-frequency module comprising these parts formed in one laminate, and a communications device comprising them.

BACKGROUND OF THE INVENTION

Wireless communications devices, for instance, mobile phones, have become popular remarkably in recent years with their functions and services improved increasingly. Explanation will be made on a mobile phone as an example. There are various systems for mobile phones, for instance, GSM (global system for mobile communications) and DCS (digital cellular system) systems widely used mostly in Europe, a PCS (personal communications services) system used in the U.S., and a PDC (personal digital cellular) system used in Japan. According to recent rapid expansion of mobile phones, however, a frequency band allocated to each system cannot allow all users to use their mobile phones in major cities in advanced countries, resulting in difficulty in connection and thus causing such a problem that mobile phones are sometimes disconnected during communication. Thus, proposal was made to permit users to utilize a plurality of systems, thereby increasing substantially usable frequency, and further to expand serviceable territories and to effectively use communications infrastructure of each system. Thus, mobile phones adaptable to a plurality of systems are called multiband mobile phones, differentiated from single-band mobile phones adaptable to only a single system.

As conventional, small and light high-frequency circuit parts adapted to a plurality of systems, for instance, a dual-band, high-frequency switch module for use in mobile communications devices adapted to two systems of EGSM and DCS is disclosed in EP 0921642, and a triple-band, high-frequency switch module for use in mobile communications devices adapted to three systems of EGSM, DCS and PCS is proposed by EP 0998035.

FIG. 23 is a block diagram showing one example of a triple-band high-frequency switch module. A diplexer Dip connected to a terminal of a common antenna ANT causes branching to a signal in a frequency band of EGSM and a signal in a frequency band of DCS/PCS. The branching may be called "synthesis" in an opposite direction of a signal flow. A first high-frequency switch SW1 switches a transmission terminal Tx of EGSM and a receiving terminal Rx of EGSM, and a second high-frequency switch SW2 switches a transmission terminal Tx of DCS/PCS, a receiving terminal Rx of DCS and a receiving terminal Rx of PCS. Low-pass filters LPF1, LPF2 inserted into signal-transmitting lines suppress harmonics generated by high-power amplifiers. Bandpass filters SAW1, SAW2, SAW3 remove unnecessary frequency components from a receiving signal from the antenna ANT and send only necessary components to low-noise amplifiers. Accordingly, high-power amplifiers HPA1, HPA2 are disposed upstream of the transmission terminal Tx of EGSM and the transmission terminal Tx of DCS/PCS, and low-noise amplifiers LNA1, LNA2, LNA3 are disposed downstream of the receiving terminal Rx of EGSM, the receiving terminal Rx of DCS and the receiving terminal Rx of PCS.

With a still strong demand for making mobile communications devices smaller and lighter in weight, development has been progressing to have common parts and integrate functions into modules. For instance, circuit parts encircled by the dotted line in FIG. 23 are integrated into a multiband antenna switch module ASM, which is obtained by forming electrode patterns for transmission lines and capacitors on dielectric sheets made of LTCC (low-temperature cofired ceramics), etc., laminating them, and mounting diodes, etc. onto the resultant laminate. As modules in a range encircled by the chain line, there are, for instance, discrete SAW filters mounted onto the laminate.

Used on the side of the transmission of the mobile communications device is a high-power amplifier of about several watts for outputting a signal of a relatively large power, which may be called "high-frequency amplifier," "power amplifier," or simply "amplifier." Because cell phones, etc. should be small and low in power consumption, the high-power amplifier consuming most of a DC power is required to be small and have a high DC-RF power-adding efficiency. Particularly, an important features of cell phones, etc. are that they are small and have long call time per one charge. Accordingly, the miniaturization and higher efficiency of the high-power amplifier are necessary. However, circuit parts containing high-power amplifiers have not been formed into a single laminate module.

As an antenna switch module, an antenna apparatus comprising an antenna exclusively used for receiving and amplifiers mounted onto a laminate with phase-adjusting circuits disposed therebetween is disclosed in JP 2000-183612 A. However, this antenna apparatus is to adjust the phase deviation of a closed loop when electromagnetic waves leaked from amplifiers are received by the antenna exclusively used for receiving (patch antenna), but to integrate high-frequency switch functions.

EP 0837516 discloses a module comprising transmission lines and capacitors for constituting high-frequency switches and amplifiers, which are formed in a multilayered board constituted by a laminate of a plurality of dielectric layers, and transistors, etc. mounted onto the multiplayer board. However, this reference teaches nothing about problems arising when the high-frequency switches and the amplifiers are integrated, and their solution means.

JP 2002-171137 A discloses a high-frequency transmission module in which a high-power amplifier and a coupler for monitoring the output power of the high-power amplifier are integrated, and both are set to be nonconjugate matching at a spurious frequency. However, this reference does not teach any specific means for solving the deterioration of the characteristics of reducing insertion loss between the high-frequency parts and harmonic attenuation characteristics.

As described above, no proposal has been made so far with respect to the integration of multiband antenna switch circuits and high-frequency amplifying circuits in one laminate as a composite module. What has been carried out so far is only that the already existing high-frequency amplifying circuits and the already existing antenna switch modules are variously combined to monitor transmission characteristics and antenna output characteristics such as conversion efficiency and the generation of harmonics, etc., thereby selecting good combinations of the parts.

When the high-frequency amplifier HPA and the antenna switch module ASM are combined in a laminate (ASM+HPA in FIG. 23), there are the same problems as when discrete parts are combined. Though an output terminal of a high-frequency amplifier and a transmission terminal of an antenna switch module are designed to match at 50 Ω, each part is not necessarily set to be 50 Ω strictly, but actuary set to be around 50 Ω. For instance, even if the high-frequency amplifier HPA and the antenna switch module ASM are 45 Ω with a phase position of 120° and 52 Ω with a phase position of 80°, respectively, it may be regarded that they are matching to each other at 50 Ω. In sum, though the conventional technology seeks matching at around 50 Ω, which is at a center of the Smith chart, in a transmission band, it does not take reactance into consideration. Without a specific guideline for the phase matching, it would be likely that there is large loss in a necessary fundamental frequency band, and that attenuation is insufficient in an unnecessary frequency band such as a second harmonic, a third harmonic, etc. This problem occurs even in a case where a high-frequency amplifying circuit and an antenna switch module are separately mounted onto a circuit board, with a matching circuit therebetween.

In addition, wide-band matching with low insertion loss in a transmission band is desired in a high-frequency module. However, even when the wide-band matching is sought only by an antenna switch module, the wide-band matching is not achieved in many cases in the entire high-frequency module comprising the high-frequency amplifier. This is because the input impedance Z4 of an output matching circuit in the high-frequency amplifier changes by a load (in this case, antenna switch module) connected to the downstream side of the high-frequency amplifier (see FIG. 10).

OBJECTS OF THE INVENTION

Accordingly, an object of the present invention is to provide a high-frequency device comprising a phase-adjusting circuit between a switch circuit and a high-frequency amplifying circuit for minimizing insertion loss in a fundamental frequency band and maximizing harmonic attenuation in n-th frequency bands.

Another object of the present invention is to provide a high-frequency device with an expanded range operable with low insertion loss and minimized insertion loss at a fundamental frequency in a transmission frequency band.

A further object of the present invention is to provide a small and light high-frequency module comprising a switch module, a high-frequency amplifying circuit module and a phase-adjusting circuit formed in one laminate, with suppressed deterioration of characteristics due to mutual interference.

A still further object of the present invention is to provide a communications device comprising the above high-frequency module.

DISCLOSURE OF THE INVENTION

The high-frequency device for handling a plurality of transmitting/receiving systems having different passbands according to an embodiment of the present invention comprises (a) a branching circuit for branching higher-frequency signals and lower-frequency signals, (b) at least one switch circuit connected to the branching circuit for switching connection to transmitting systems and receiving systems, (c) a plurality of high-frequency amplifying circuits, and (d) a phase-adjusting circuit disposed between each of the switch circuits and each of the high-frequency amplifying circuits, wherein the phase matching between each of the switch circuits and each of the high-frequency amplifying circuits via the phase-adjusting circuit is adjusted to conjugate matching in a fundamental frequency band, while it is adjusted in a nonconjugate matching range in n-th frequency bands, wherein n is an integer of 2 or more.

In the high-frequency device, $\theta_2$ is adjusted preferably within $\theta_0 \pm 120°$ in the n-th frequency bands, wherein $\theta_0$ is a phase opposite to a phase $\theta_1$ by 180°, and $\theta_1$ is conjugate to a phase $\theta$ of an impedance $Z_1$ of each of the high-frequency amplifiers when viewed from a connection reference plane between each of the switch circuits and each of the high-frequency amplifying circuits, and $\theta_2$ is a phase of an impedance $Z_2$ of each of the switch circuits when viewed from the connection reference plane. $\theta_2$ is adjusted more preferably within a range of $\theta_0 \pm 90°$, further preferably within a range of $\theta_0 \pm 45°$.

The high-frequency module constituted by an integral laminate for handling a plurality of transmitting/receiving systems having different passbands according to another embodiment of the present invention comprises (a) a switch module part for branching higher-frequency signals and lower-frequency signals and switching connection to the transmitting systems and the receiving systems, (b) a high-frequency amplifying circuit module part, and (c) a phase-adjusting circuit disposed between the switch module part and the high-frequency amplifying circuit module part, wherein the phase matching between the switch module part and the high-frequency amplifying circuit module part via the phase-adjusting circuit is adjusted to conjugate matching in a fundamental frequency band, while it is adjusted in a nonconjugate matching range in n-th frequency bands, wherein n is an integer of 2 or more.

In the high-frequency module, $\theta_2$ is adjusted preferably within $\theta_0 \pm 120°$ in the n-th frequency bands, wherein $\theta_0$ is a phase opposite to a phase $\theta_1$ by 180°, and $\theta_1$ is conjugate to a phase $\theta$ of an impedance $Z_1$ of the high-frequency amplifying circuit module part when viewed from a connection reference plane between the switch module part and the high-frequency amplifying circuit module part, and $\theta_2$ is a phase of an impedance $Z_2$ of the switch module part when viewed from the connection reference plane. $\theta_2$ is adjusted more preferably within a range of $\theta_0 \pm 90°$, further preferably within a range of $\theta_0 \pm 45°$.

In a case where the phase-adjusting circuit is a low-pass filter constituted by an LC circuit, when a phase $\theta_3$ of the impedance Z3 of the switch module part when viewed from a terminal of the phase-adjusting circuit on the side of the switch module part is present on the counterclockwise side of $\theta_0$ on a Smith chart, a phase $\theta_2$ of an impedance Z2 of the switch module part when viewed from the connection reference plane is adjusted by the phase-adjusting circuit, such that the phase $\theta_2$ is closer to $\theta_0$ than $\theta_3$ in n-th frequency bands.

In a case where the phase-adjusting circuit is constituted by a transmission line, when a phase $\theta_3$ of an impedance Z3 is present on the counterclockwise side of $\theta_0$ on a Smith chart, the phase $\theta_2$ of the impedance Z2 is preferably adjusted by making the transmission line longer, such that the phase $\theta_2$ is closer to $\theta_0$ than $\theta_3$ in n-th frequency bands.

In a case where the phase-adjusting circuit is a high-pass filter constituted by an LC circuit, when a phase $\theta_3$ of the impedance Z3 is present on the clockwise side of $\theta_0$ on a Smith chart, the phase $\theta_2$ of the impedance Z2 is preferably adjusted by the phase-adjusting circuit, such that the phase $\theta_2$ is closer to $\theta_0$ than $\theta_3$ in n-th frequency bands. An end of an inductor in an LC circuit constituting the high-pass filter is preferably connected to the switch module part without interposing a capacitor, with its other end grounded.

In a case where the phase-adjusting circuit is constituted by a transmission line, when a phase $\theta_3$ of the impedance Z3 is present on the clockwise side of $\theta_0$ on a Smith chart, the phase $\theta_2$ of the impedance Z2 is preferably adjusted by making the transmission line shorter, such that the phase $\theta_2$ is closer to $\theta_0$ than $\theta_3$ in n-th frequency bands.

When the low-pass filter or the high-pass filter is constituted by a chip inductor and a chip capacitor, the mounting of the chip inductor and the chip capacitor on the laminate or on the circuit board is preferable because it makes it possible to change these parts at any time after integration to the module.

The high-frequency device for handling a plurality of transmitting/receiving systems having different passbands according to a further embodiment of the present invention comprises (a) a branching circuit for branching higher-frequency signals and lower-frequency signals, (b) at least one switch circuit connected to the branching circuit for switching connection to transmitting systems and receiving systems, (c) a plurality of high-frequency amplifying circuits, and (d) a phase-adjusting circuit disposed between each of the switch circuits and each of the high-frequency amplifying circuits, wherein a phase $\theta_2$ of an impedance $Z_2$ of each of the switch circuits when viewed from a connection reference plane between each of the switch circuits and each of the high-frequency amplifying circuits is adjusted to a range of $-125°$ to $+90°$ in a fundamental frequency band. This high-frequency device is characterized by wide-band matching at low insertion loss.

The high-frequency device for handling a plurality of transmitting/receiving systems having different passbands according to a still further embodiment of the present invention comprises (a) a branching circuit for branching higher-frequency signals and lower-frequency signals, (b) at least one switch circuit connected to the branching circuit for switching connection to transmitting systems and receiving systems, (c) a plurality of high-frequency amplifying circuits, and (d) a phase-adjusting circuit disposed between each of the switch circuits and each of the high-frequency amplifying circuits, wherein a phase $\theta_2$ of an impedance $Z_2$ of each of the switch circuits when viewed from a connection reference plane between each of the switch circuits and each of the high-frequency amplifying circuits is adjusted in a conjugate matching range within $\theta_1 \pm 90°$ in a fundamental frequency band, the $\theta_1$ being conjugate to a phase $\theta$ of an impedance $Z_1$ of each of the high-frequency amplifiers when viewed from the connection reference plane This high-frequency device is characterized by a low insertion loss.

The high-frequency device for handling a plurality of transmitting/receiving systems having different passbands according to a still further embodiment of the present invention comprises (a) a branching circuit for branching higher-frequency signals and lower-frequency signals, (b) at least one switch circuit connected to the branching circuit for switching connection to transmitting systems and receiving systems, (c) a plurality of high-frequency amplifying circuits, and (d) a phase-adjusting circuit disposed between each of the switch circuits and each of the high-frequency amplifying circuits, wherein a phase $\theta_2$ of an impedance $Z_2$ of each of the switch circuits when viewed from a connection reference plane between each of the switch circuits and each of the high-frequency amplifying circuits is adjusted in a conjugate matching range within $\theta_1 \pm 90°$ and in a range of $-125°$ to $+90°$ in a fundamental frequency band, the $\theta_1$ being conjugate to a phase $\theta$ of an impedance $Z_1$ of each of the high-frequency amplifiers when viewed from the connection reference plane This high-frequency device is characterized by wide-band matching and a low insertion loss.

The high-frequency module constituted by an integral laminate for handling a plurality of transmitting/receiving systems having different passbands according to a still further embodiment of the present invention comprises (a) a switch module part for branching higher-frequency signals and lower-frequency signals and switching connection to the transmitting systems and the receiving systems, (b) a high-frequency amplifying circuit module part, and (c) a phase-adjusting circuit disposed between the switch module part and the high-frequency amplifying circuit module part, wherein a phase $\theta_2$ of an impedance Z2 of the switch module part when viewed from a connection reference plane between the high-frequency amplifying circuit module part and the switch module part is adjusted to a range of $-125°$ to $+90°$ in a fundamental frequency band by the phase-adjusting circuit. This high-frequency module is characterized by wide-band matching at a low insertion loss.

The high-frequency module constituted by an integral laminate for handling a plurality of transmitting/receiving systems having different passbands according to a still further embodiment of the present invention comprises (a) a switch module part for branching higher-frequency signals and lower-frequency signals and switching connection to the transmitting systems and the receiving systems, (b) a high-frequency amplifying circuit module part, and (c) a phase-adjusting circuit disposed between the switch module part and the high-frequency amplifying circuit module part, wherein a phase $\theta_2$ of an impedance $Z_2$ of the switch module part when viewed from a connection reference plane between the switch module part and the high-frequency amplifying circuit module part is adjusted in a conjugate matching range within $\theta_1 \pm 90°$ in a fundamental frequency band by the phase-adjusting circuit, the $\theta_1$ being conjugate to a phase $\theta$ of an impedance $Z_1$ of the high-frequency amplifying circuit module part when viewed from the connection reference plane This high-frequency module is characterized by a low insertion loss.

The high-frequency module constituted by an integral laminate for handling a plurality of transmitting/receiving systems having different passbands according to a still further embodiment of the present invention comprises (a) a switch module part for branching higher-frequency signals and lower-frequency signals and switching connection to the transmitting systems and the receiving systems, (b) a high-frequency amplifying circuit module part, and (c) a phase-adjusting circuit disposed between the switch module part and the high-frequency amplifying circuit module part, wherein a phase $\theta_2$ of an impedance $Z_2$ of the switch module part when viewed from a connection reference plane between the switch module part and the high-frequency amplifying circuit module part is adjusted in a conjugate matching range within $\theta_1 \pm 90°$ and in a range of $-125°$ to $+90°$ in a fundamental frequency band by the phase-adjusting circuit, the $\theta_1$ being conjugate to a phase $\theta$ of an impedance $Z_1$ of the high-frequency amplifying circuit module part when viewed from the connection reference plane This high-frequency module is characterized by wide-band matching and a low insertion loss.

The high-frequency device for handling a plurality of transmitting/receiving systems having different passbands according to a still further embodiment of the present invention comprises (a) a branching circuit for branching higher-frequency signals and lower-frequency signals, (b) at least one switch circuit connected to the branching circuit for switching connection to transmitting systems and receiving systems, (c) a plurality of high-frequency amplifying circuits, and (d) a phase-adjusting circuit disposed between each of the switch circuits and each of the high-frequency amplifying circuits, wherein a phase $\theta_2$ of an impedance $Z_2$ of each of the switch circuits when viewed from a connection reference plane between each of the switch circuits and each of the high-frequency amplifying circuits is adjusted by the phase-adjusting circuit, (1) in a conjugate matching range within $\theta_1 \pm 90°$ and in a range of $-125°$ to $+90°$ in a fundamental frequency band, and (2) in a nonconjugate matching range within $\pm 120°$ ($\theta_0 \pm 120°$) from a phase $\theta_0$ opposite to a phase $\theta_1$ by $180°$ in n-th frequency bands, wherein n is an integer of 2 or more, the $\theta_1$ being conjugate to a phase $\theta$ of an impedance $Z_1$ of each of the high-frequency amplifiers when viewed from the connection reference plane The high-frequency module constituted by an integral laminate for handling a plurality of transmitting/receiving systems having different passbands according to a still further embodiment of the present invention comprises (a) a switch module part for branching higher-frequency signals and lower-frequency signals and switching connection to the transmitting systems and the receiving systems, (b) a high-frequency amplifying circuit module part, and (c) a phase-adjusting circuit disposed between the switch module part and the high-frequency amplifying circuit module part, wherein a phase $\theta_2$ of impedance $Z_2$ of the switch module part when viewed from a connection reference plane between the switch module part and the high-frequency amplifying circuit module part is adjusted by the phase-adjusting circuit, (1) in a conjugate matching range within $\theta_1 \pm 90°$ and in a range of $-125°$ to $+90°$ in a fundamental frequency band, and (2) in a nonconjugate matching range within $\pm 120°$ ($\theta_0 \pm 120°$) from a phase $\theta_0$ opposite to a phase $\theta_1$ by $180°$ in n-th frequency bands, wherein n is an integer of 2 or more, the $\theta_1$ being conjugate to a phase $\theta$ of an impedance $Z_1$ of the high-frequency amplifying circuit module part when viewed from the connection reference plane In the high-frequency module according to a still further embodiment of the present invention, a region containing the high-frequency amplifying circuit module part and a region containing the switch module part are shielded from each other by a shielding electrode formed on at least one of dielectric layers constituting the laminate, or by through-hole electrodes penetrating a plurality of dielectric layers constituting the laminate. Other parts than the shielding electrode and the through-hole electrodes may be the same as in the above-described high-frequency modules. The through-hole may be called "via-hole" or simply "via."

Said shielding electrode is preferably formed on a layer above or below a dielectric layer provided with transmission lines. Said through-hole electrodes are preferably connected to the shielding electrode. Said through-hole electrodes are preferably connected to ground electrodes formed on other dielectric layers.

Said switch module part preferably comprises a branching circuit for branching higher-frequency signals and lower-frequency signals, and switch circuits connected to the branching circuit for switching connection to transmitting systems and receiving systems.

The high-frequency amplifying circuit module part preferably comprises at least a semiconductor element, a power-applying circuit and a matching circuit.

In the above high-frequency module, at least part of transmission lines and LC circuits constituting the switch module part, the high-frequency amplifying circuit module part and the phase-adjusting circuit are formed by electrode patterns formed on dielectric layers constituting the laminate, and chip elements constituting part of switching elements, semiconductor elements and LC circuits constituting the switch module part and the high-frequency amplifying circuit module part are preferably mounted onto the laminate.

It is preferable that the branching circuit is constituted by an LC circuit, that main elements of the switch circuits are switching elements and transmission lines, that at least part of the LC circuits and the transmission lines are formed by electrode patterns formed on dielectric layers constituting the laminate, and that chip elements constituting part of the switching elements and the LC circuits are mounted onto the laminate.

Said high-frequency amplifying circuit module part preferably comprises at least a semiconductor element, a power-applying circuit and a matching circuit, at least part of transmission lines and LC circuits constituting the power-applying circuit and the matching circuit being formed by electrode patterns formed on dielectric layers constituting the laminate, and chip elements constituting part of the switching elements and the LC circuits being mounted onto the laminate.

At least part of transmission lines or LC circuits constituting the phase-adjusting circuit are preferably formed by electrode patterns formed on dielectric layers constituting the laminate.

Each transmitting system in the switch circuits preferably comprises a low-pass filter constituted by an LC circuit, the LC circuit being formed by electrode patterns on dielectric layers constituting the laminate.

The high-frequency module of the present invention preferably comprises at least one of a coupler circuit, an isolator circuit and a filter circuit between the high-frequency amplifying circuit module part and the switch module part.

The high-frequency device according to a still further embodiment of the present invention comprises high-frequency amplifying circuits, and high-frequency circuits disposed downstream of the high-frequency amplifying circuits for treating a high-frequency signal amplified by the high-frequency amplifying circuits, which are connected to each other via a phase-adjusting circuit, wherein a phase $\theta_2$ of an impedance Z2 of each of the downstream high-frequency circuits when viewed from a reference point of the phase-adjusting circuit on the side of the high-frequency amplifying circuit is adjusted within $\theta_0 \pm 120°$ in a frequency that is n times (n is an integer of 2 or more) the fundamental frequency of the high-frequency signal, the $\theta_0$ being an opposite phase to a phase $\theta_1$, which is conjugate to a phase $\theta$ of an impedance Z1 of the high-frequency amplifying circuit when viewed from the reference point.

The above high-frequency amplifying circuit preferably comprises at least a semiconductor element, a power-applying circuit and a matching circuit.

The communications device for transmitting and receiving two or more signals having different frequencies via one common antenna according to a still further embodiment of the present invention comprises the above high-frequency device or the above high-frequency module, which is connected to the common antenna.

BRIEF DESCRIPTION OF THE DRAWINGS

FIG. 2 (*b*) is a Smith chart showing another procedure of the phase adjustment;

FIG. 3 (b) is a view showing another example of the circuit of a low-pass filter, one of specific means for the phase adjustment;

FIG. 3 (c) is a view showing a further example of the circuit of a low-pass filter, one of specific means for the phase adjustment;

FIG. 3 (d) is a view showing a still further example of the circuit of a low-pass filter, one of specific means for the phase adjustment;

FIG. 4 (b) is a view showing another example of the circuit of a high-pass filter, one of specific means for the phase adjustment;

FIG. 4 (c) is a view showing a further example of the circuit of a high-pass filter, one of specific means for the phase adjustment;

FIG. 4 (d) is a view showing a still further example of the circuit of a high-pass filter, one of specific means for the phase adjustment;

FIG. 9 (b) is a Smith chart showing another example of the procedures of a specific phase adjustment;

FIG. 13 (b) is a view showing a circuit portion of the antenna switch module part near its transmission terminal, which has a transmission line as a phase adjustment means;

FIG. 15 (b) is a graph showing the relation between the input phase of ASM and thrid harmonic attenuation;

BEST MODE FOR CARRYING OUT THE INVENTION

[1.1] Attenuation of Harmonics and Phase Adjustment in n-th Frequency band

Figure 10:
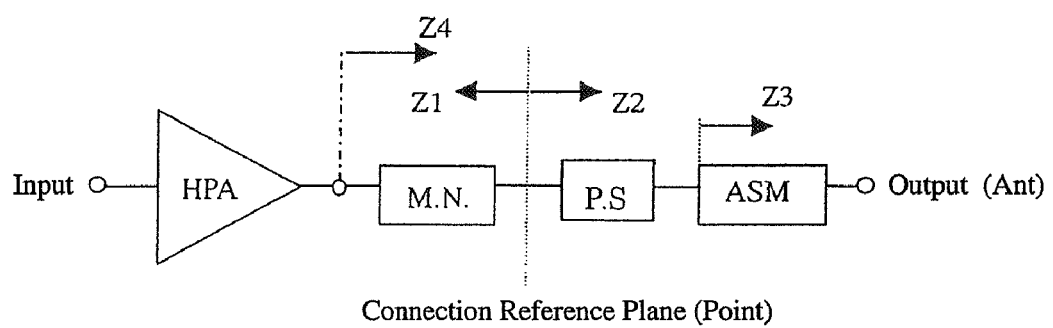
FIG. 10 is a block diagram showing a model for explaining the phase adjustment of the present invention.

Referring to a model shown in FIG. 10, investigation will be conducted on the influence of phase relations between a high-frequency amplifier HPA and an antenna switch module ASM on antenna output characteristics. The high-frequency module shown in FIG. 10 comprises a high-frequency amplifier HPA, an output-matching circuit MN, a phase shifter PS and an antenna switch module ASM in this order. FIG. 10 shows an example for transmission, with the output terminal of the antenna switch module ASM connected to an antenna. There is a connection reference plane between a terminal of the high-frequency amplifier HPA on the side of the output matching circuit MN and a transmission terminal of the antenna switch module ASM. The term "connection reference plane" used herein means a plane between two circuits in determining impedance by computer simulation, taking into consideration the thickness and width of actual lines, which corresponds to the connection reference point in the equivalent circuit.

Figure 1:
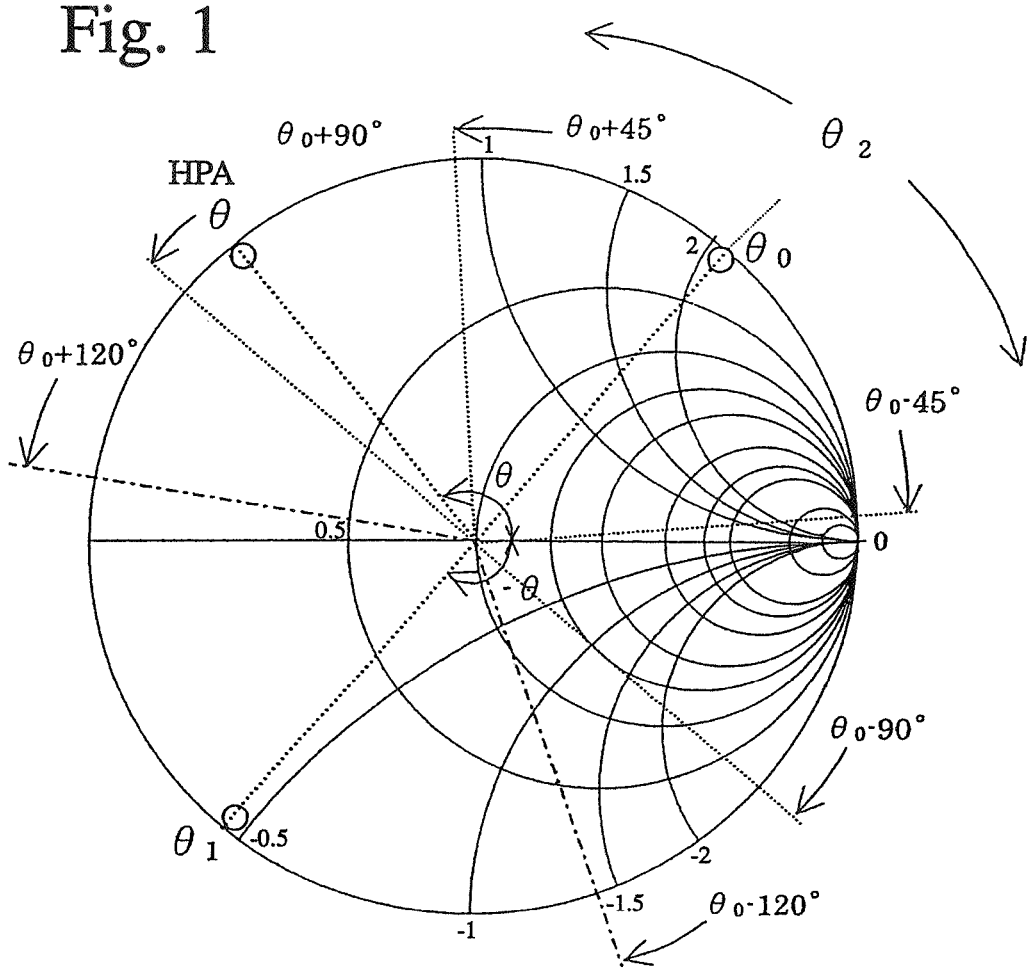
FIG. 1 is a Smith chart showing the phase adjustment of the multiband high-frequency device of the present invention.

With the impedance Z1 of the high-frequency amplifier HPA having a fixed phase θ when viewed from the connection reference plane the phase $\theta_2$ of the impedance Z2 of the antenna switch module ASM was changed, to plot phase change, insertion loss, and attenuation in a fundamental frequency, a second harmonic and a third harmonic in the Smith chart of FIG. 1. Contrary to the above, with the fixed phase $\theta_2$ of the impedance Z2 of the antenna switch module ASM when viewed from the connection reference plane the phase θ of the impedance Z1 of the high-frequency amplifier HPA may be adjusted, and both impedance phases of the high-frequency amplifier HPA and the antenna switch module ASM may be adjusted. This is true in subsequent embodiments, any cases being included in the scope of the present invention.

The term "antenna switch module part" or "antenna switch module" is used herein when the high-frequency module is connected to a common antenna, having substantially the same meaning as the term "antenna switch circuit" used when the high-frequency device is connected to the common antenna.

It has been found as a result of investigation that the phase adjustment has a close relation to the antenna output characteristics (insertion loss, attenuation of harmonics, etc.,), their impedances in n-th harmonic bands greatly affecting the characteristics of the overall high-frequency module. Referring to the Smith chart of FIG. 1, the following may be said.

(A) When the phase $\theta_2$ of the impedance Z2 of the antenna switch module ASM when viewed from the connection reference plane is equal to a phase $\theta_1$ (−θ) obtained by changing the sign of the phase θ of the impedance Z1 of the high-frequency amplifier HPA, the insertion loss (signal attenuation) is the minimum. The phase $\theta_1$ is conjugate matching to the phase θ.

(B) When the phase $\theta_2$ of the impedance Z2 of the antenna switch module ASM when viewed from the connection reference plane is equal to $\theta_0$ ($\theta_1 \pm 180°$), which is an opposite phase to $\theta_1$, the insertion loss (signal attenuation) is the maximum.

The term "conjugate impedance" used herein means impedance in a relation of complex conjugate to certain impedance. The term "conjugate" means that two impedances have the same resistor component and the same reactance component with opposite signs. The impedance of θ, (R+jX), is complex conjugate to the impedance of $\theta_1$, (R−jX). A case where such relation is satisfied is "conjugate matching," achieving the impedance matching.

Though the conjugate matching of (R+jX) and (R−jX) is ideally optimum, investigation by the inventors has revealed that only the adjustment of the reactance component such as (R'−jX) would be sufficiently effective for the reduction of insertion loss of a transmission signal and the attenuation of n-th harmonics. It has been found that though the matching of all the impedance (R+jX) is difficult, the matching of at least a phase would be a sufficiently effective, practical control means.

The first guideline in the present invention is that this conjugate matching is satisfied with respect to a phase, to meet the condition (A) to minimize the insertion loss in a fundamental frequency band, thereby setting a phase relation corresponding to the conjugate matching of the impedance Z1. Namely, the phase-adjusting circuit connecting the high-frequency amplifier HPA and the antenna switch module ASM adjusts them in conjugate matching at the standard value of 50 Ω, thereby minimizing the insertion loss.

To meet the condition (B) for maximizing the attenuation of unnecessary n-th frequency bands (harmonic bands) such as a second harmonic, a third harmonic, etc., the phase $\theta_2$ of the impedance Z2 is adjusted to a phase $\theta_0$ corresponding to a nonconjugate matching. The nonconjugate matching is a state other than the conjugate matching. A nonconjugate matching position to the phase $\theta_2$ is optimally $\theta_0$, an opposite phase to $\theta_1$, and it has been found that the effect of the present invention can be obtained sufficiently in a predetermined range around $\theta_0$. Specifically, the control range of $\theta_2$ is preferably in a range of $\theta_0 \pm 120°$, which permits 5 dB deterioration to the maximum attenuation. The control range of $\theta_2$ is more preferably $\theta_0 \pm 90°$, which permits 3 dB deterioration, most preferably $\theta_0 \pm 45°$. In the adjustment of $\theta_2$, the phase $\theta_2$ is first moved from the phase $\theta_1$ corresponding to the conjugate matching to near the opposite phase $\theta_0$, and then finely adjusted in a permitted range with $\theta_0$ at a center.

[1.2] Phase Adjustment Means of n-th Frequency Bands

Figure 12:
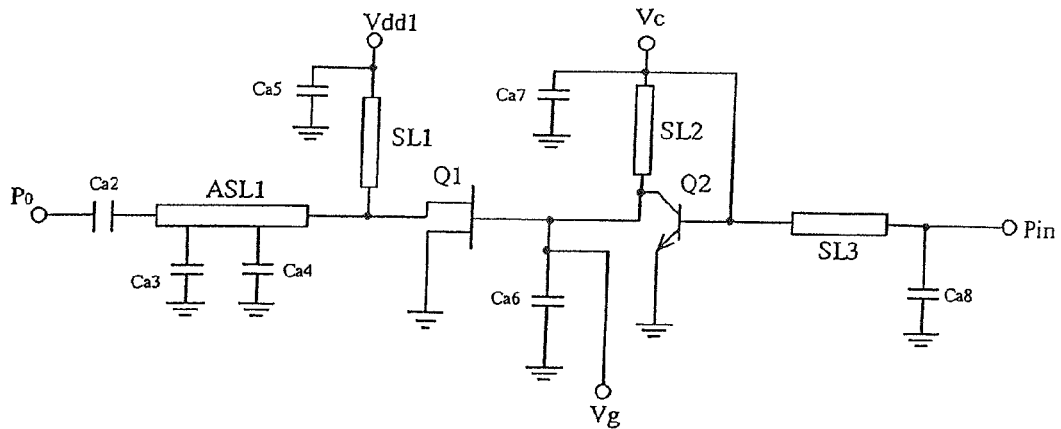
FIG. 12 is a view showing an equivalent circuit of the high-frequency amplifier according to one embodiment of the present invention.
Figure 13A:
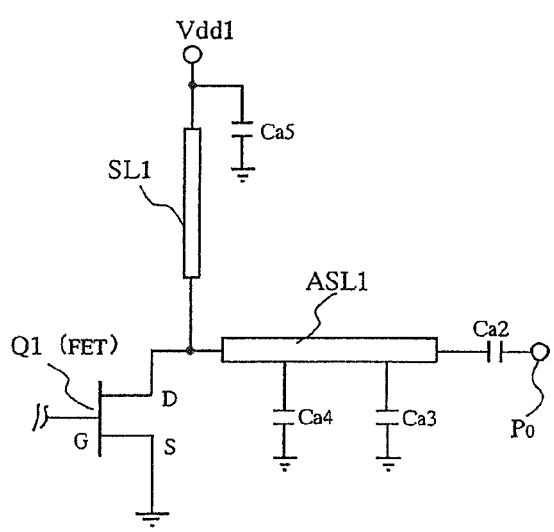
FIG. 13 (a) is a view showing a circuit portion of the high-frequency amplifier near its output terminal, which has a transmission line as a phase adjustment means.
Figure 13B:
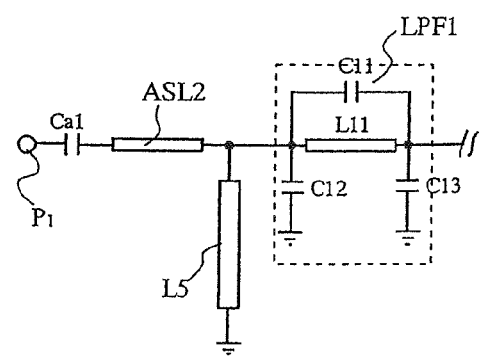

The phase-adjusting circuit is constituted by a transmission line or an LC circuit. FIGS. 13 (a) and (b) show the phase-adjusting circuit comprising a transmission line. FIG. 13 (a) shows a circuit portion of the high-frequency amplifier shown in FIG. 12 near the output terminal P0, and FIG. 13 (b) shows a circuit portion of the switch module shown in FIG. 11 near the transmission terminal P1.

The circuit portion of the high-frequency amplifier near the output terminal P0 as shown in FIG. 13 (a) comprises a semiconductor element FET (field effect transistor) Q1, and voltage is applied to a drain terminal D of the transistor Q1 from a terminal Vdd1 via a transmission line or inductor SL1. The drain terminal D is connected to the output terminal P0 via a transmission line ASL1 and a DC-blocking capacitor Ca2. Also, in the circuit portion of the antenna switch module near the transmission terminal P1 as shown in FIG. 13 (b), the transmission terminal P1 is connected to a DC-blocking capacitor Ca1 and a transmission line ASL2, and then to a low-pass filter LPF constituted by a transmission line L5 and an LC circuit, which is part of the transmitting system circuit. When the output terminal P0 and the transmission terminal P1 are connected to each other, one of the capacitors Ca1, Ca2 may be omitted.

Though the transmission lines ASL1, ASL2 function as output matching circuits, they may be used as phase-adjusting circuits as in the above case (3). Alternatively, an LC circuit may be disposed in place of the transmission line as in the above case (1). For instance, the transmission line ASL2 is an element necessary for connecting the transmission terminal P1 and the low-pass filter LPF1 in the laminate, but it may be used as the phase-adjusting circuit of the present invention, too. In this case, capacitors Ca3, Ca4 with proper capacitance are first inserted at proper positions in designing the transmission line ASL2, while adjusting the length or width of the transmission line ASL1 of the high-frequency amplifier, to achieve matching with the input impedance of an antenna switch at substantially 50 Ω, and the length and/or width of the transmission line ASL2 are then adjusted. If necessary, the length and width of L5, etc. are also adjusted.

[1.3] Specific Examples of Phase Adjustment in n-th Frequency Bands

Figure 2A:
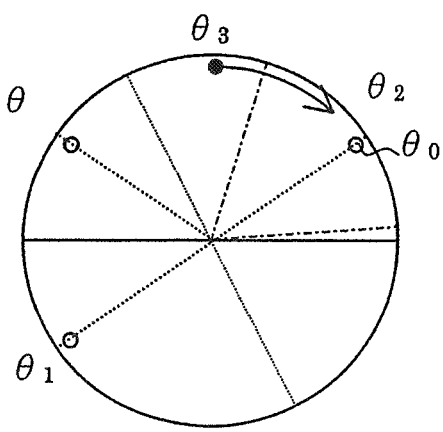
FIG. 2 (*a*) is a Smith chart showing one example of the procedures of the phase adjustment.
Figure 2B:
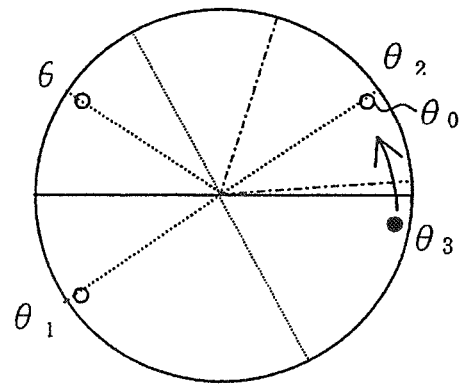
Figure 3A:
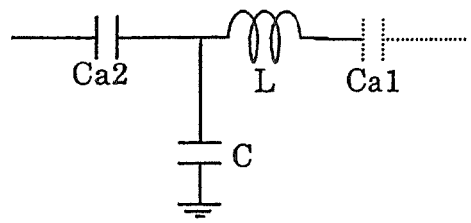
FIG. 3 (a) is a view showing one example of the circuit of a low-pass filter, one of specific means for the phase adjustment.
Figure 3B:
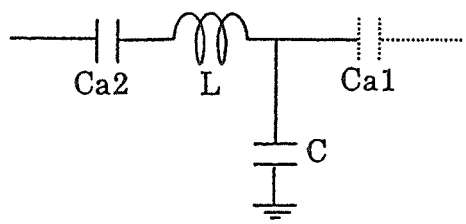
Figure 3C:
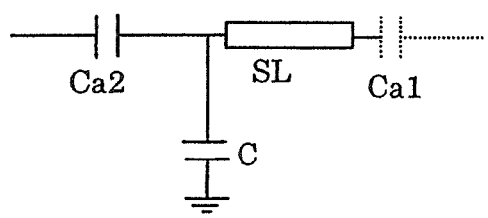
Figure 3D:
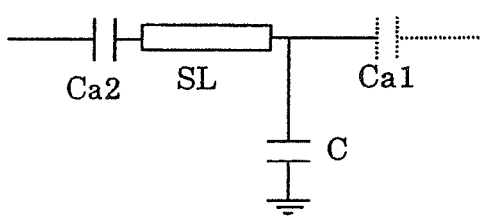
Figure 4A:
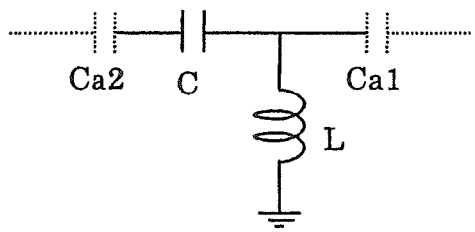
FIG. 4 (a) is a view showing one example of the circuit of a high-pass filter, one of specific means for the phase adjustment.
Figure 4B:
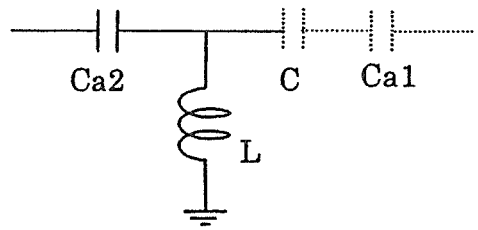
Figure 4C:
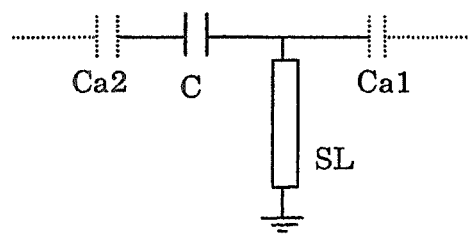
Figure 4D:
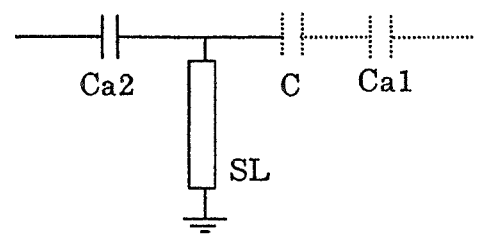

With respect to the phase adjustment for the maximum attenuation in n-th frequency bands, the following has been found:

(a) When the phase $\theta_3$ of the impedance Z3 of the antenna switch circuit ASM when viewed from the side of the output control circuit MN is present on the counterclockwise side of $\theta_0$ on a Smith chart as shown in FIG. 2 (a), the transmission line for the phase-adjusting circuit is made longer such that $\theta_2$ becomes closer to the best phase $\theta_0$ than $\theta_3$. The transmission line may be made thinner. In that case, $\theta_2$ moves clockwise when $\theta_3$ is on an upper half circle on a Smith chart, and counterclockwise when $\theta_3$ is on a lower half circle. Accordingly, when the transmission line is made thinner, it is necessary to consider the present position and rotation direction of $\theta_3$ on a Smith chart.

(b) When the phase $\theta_3$ is present on the clockwise side of $\theta_0$ on a Smith chart as shown in FIG. 2 (b), the transmission line of the phase-adjusting circuit is made shorter to obtain $\theta_2$ closer to the best phase $\theta_0$ than $\theta_3$. The adjustment of the transmission line ASL1 is preferably to make it thicker and shorter. However, in a case where the transmission line is made thicker, on the contrary to making thinner, $\theta_2$ moves counterclockwise when $\theta_3$ is on an upper half circle on a Smith chart, and clockwise when $\theta_3$ is on a lower half circle. Accordingly, it is also necessary to consider the present position and rotation direction of $\theta_3$.

To make adjustment in a range not satisfied by the above adjustments, or to make fine adjustment after lamination, etc., for instance, the following procedures are performed.

(c) When the phase $\theta_3$ is on the counterclockwise side of $\theta_0$ on a Smith chart as shown in FIG. 2 (a), a low-pass filter constituted by the LC circuit shown in any of FIGS. 3

(a)-(d) is preferably disposed between the terminals P0 and P1 to obtain $\theta_2$ closer to the best phase $\theta_0$. In this case, because of the existence of the DC-blocking capacitors Ca1, Ca2 shown in FIG. 13 and the capacitor C in the LC circuit, at least one of these capacitors may be left. For instance, Ca1 is omitted and shown by the dotted line in FIGS. 3 (a)-(d). If the capacitor Ca1 is omitted in the antenna switch module ASM in FIGS. 3 (b) and (d), parallel resonance can be achieved with the grounded transmission line L5. In this case, because the transmission line L5 may be short, it is convenient for layout adjustment at the time of lamination.

(d) When the phase $\theta_3$ is on the clockwise side of $\theta_0$ on a Smith chart as shown in FIG. 2 (b), it is preferable to dispose a high-pass filter of an LC circuit shown in any of FIGS. 4(a)-(d) between the terminals P0 and P1 to obtain $\theta_2$ closer to the best phase $\theta_0$. In this case, too, at least one of the DC-blocking capacitors Ca1, Ca2 and the capacitor C in the LC circuit need only be left. Such phase adjustment by inserting the high-pass filter is desirable to make the circuit simple.

If necessary, the width of the transmission line L5, the capacitance of the parallel capacitor C of LPF, etc. may be adjusted.

It is thus clear from the above that in the circuit designing of the high-frequency composite parts containing high-frequency amplifiers, if semiconductor elements, for instance, in a range from the output matching circuit of the transistor to the connection point of the antenna switch part, are designed taking into account not only a fundamental frequency but also harmonics in n-th frequency bands, the characteristics of a transmission output from an antenna are drastically improved as compared with those of conventional designing methods considering only the fundamental frequency.

Figure 5:
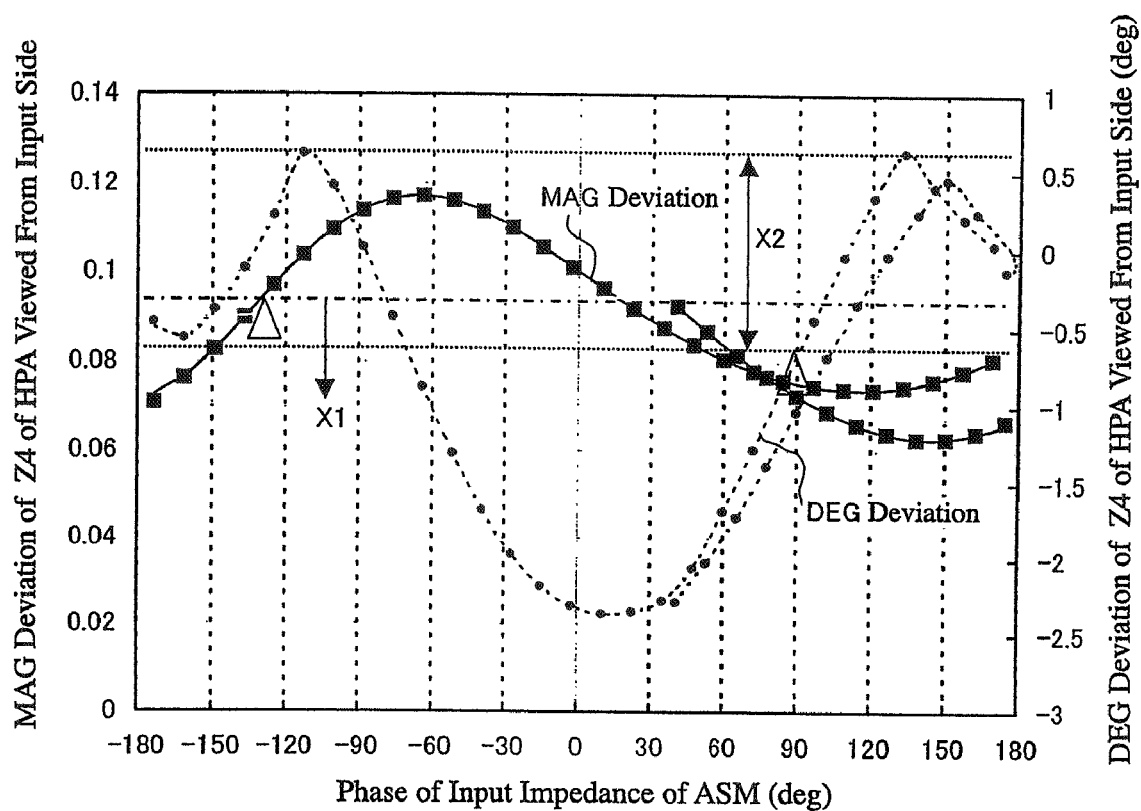
FIG. 5 is a graph showing the relation between the phase of the input impedance of the antenna switch module part and the deviation of the impedance of the high-frequency amplifier when viewed from the input side.
Figure 6:
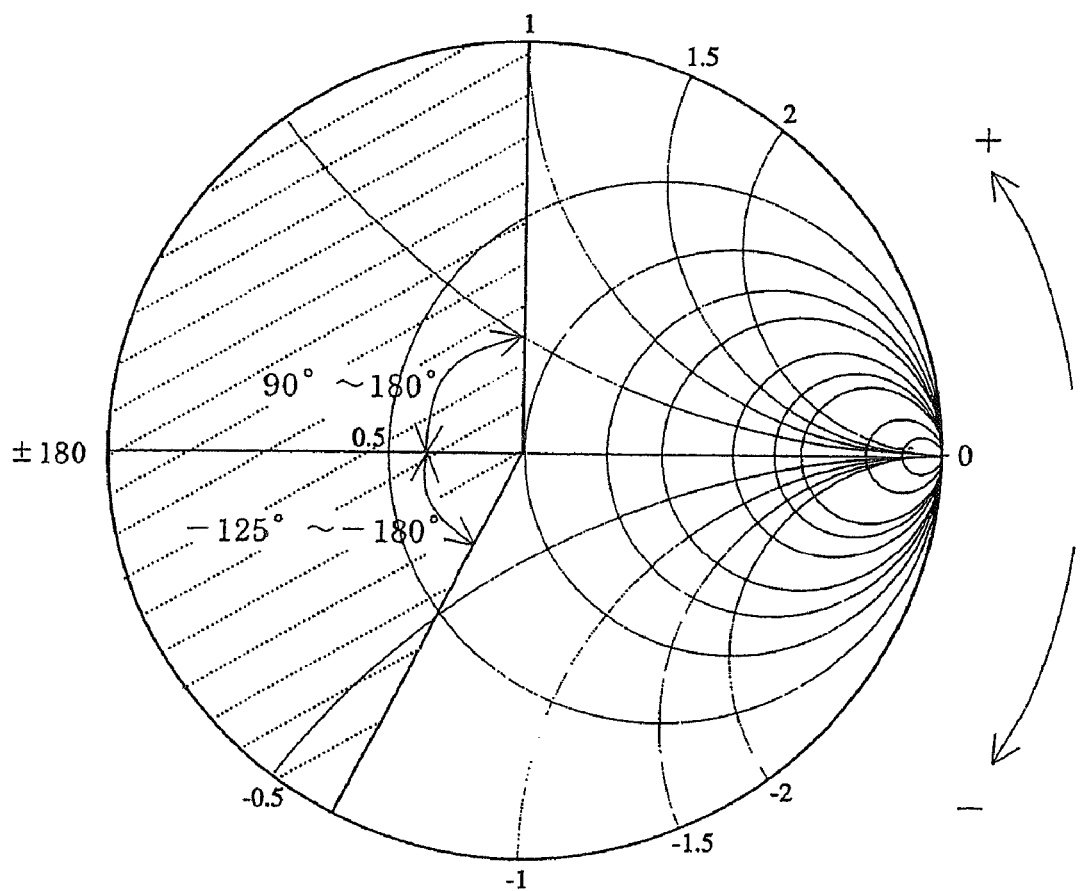
FIG. 6 is a Smith chart showing the phase adjustment range of the impedance in FIG. 5.

[2.1] Relation Between Transmission Bandwidth and Insertion Loss and Phase Adjustment The influence of the phase relation of the high-frequency amplifier and the antenna switch module part on a matching bandwidth and insertion loss in a fundamental frequency band has been investigated. In the model shown in FIG. 10, the relation between the phase change of the impedance Z3 of the antenna switch module ASM, and the amount of variation (deviation) of the input impedance Z4 of the output matching circuit MN in a transmission band has been investigated. FIG. 5 shows the relation between the phase of the input impedance of ASM and the impedance deviation of Z4, and FIG. 6 shows on a low loss range in the Smith chart. In FIG. 5, the abscissa axis indicates the phase of the input impedance of the antenna switch module ASM, the left ordinate axis indicates the MAG (absolute value of impedance, radius on a Smith chart) deviation of the impedance Z4 of the output matching circuit MN when viewed from the input terminal of HPA, and the right ordinate axis indicates the DEG (phase angle, angle from a right short position at the center on a Smith chart) deviation of the impedance Z4 of the output matching circuit MN when viewed from the input terminal of HPA. The smaller the MAG and DEG deviations, the smaller the impedance variation in the band, achieving wide-band phase matching. The permissible range of the MAG deviation is on or below a horizontal line X1 of 0.09, and the permissible range of the DEG deviation is between horizontal lines X2, ±0.6° from a center of 0.

Figure 7:
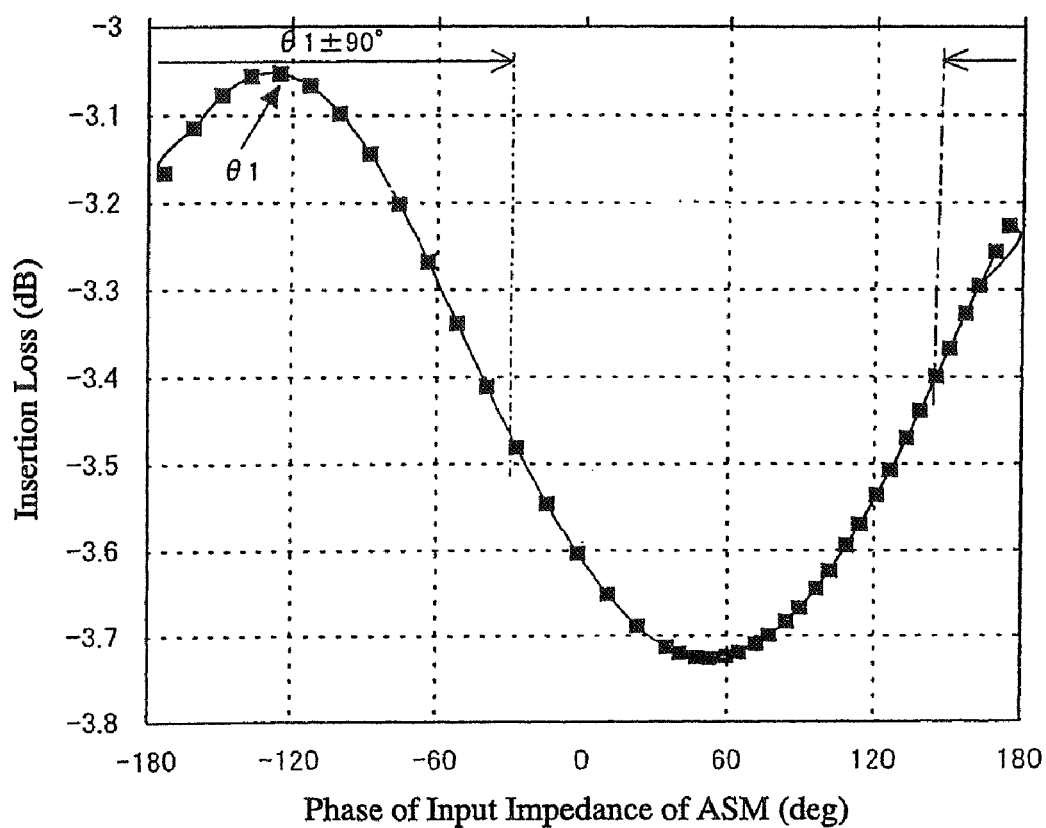
FIG. 7 is a graph showing the relation between the input phase of the antenna switch module part and insertion loss in a fundamental frequency band.
Figure 8:
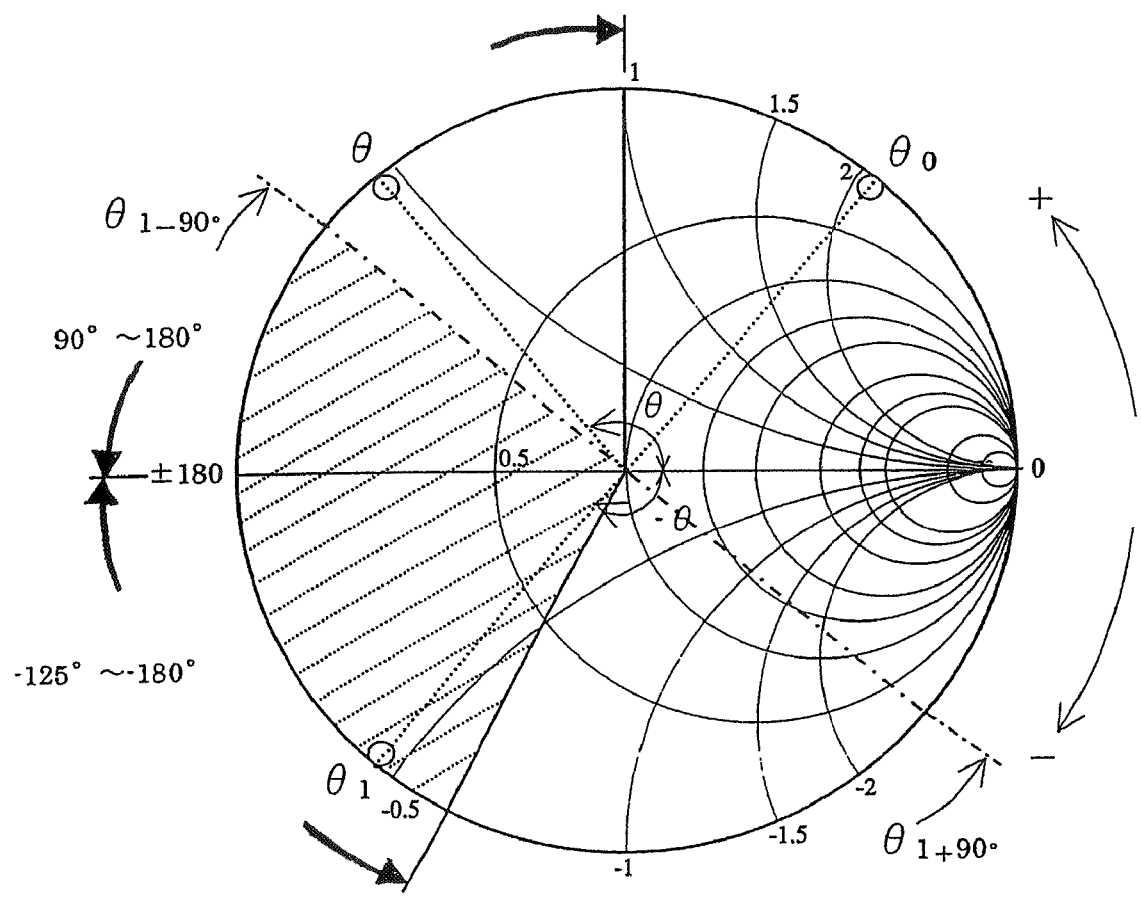
FIG. 8 is a Smith chart showing a range providing a low insertion loss in the phase adjustment range of the input impedance of the antenna switch module part.

The relation of the phase change of ASM and insertion loss in a fundamental frequency band has been investigated by changing the impedance Z2 of the antenna switch module part ASM, with the fixed impedance Z1 of the high-frequency amplifier HPA when viewed from the connection reference plane FIG. 7 shows the relation between the phase of the input impedance of ASM and insertion loss in a fundamental frequency band, and FIG. 8 shows a phase relation. The investigation has revealed that there is a close relation between the phase change and the insertion loss as described below.

(a) Wide-band phase matching, which may sometimes be called simply "wide-band matching," can be achieved in a fundamental frequency band by suppressing the amount of variation (deviation) of the impedance Z4. Namely, the wide-band matching can be achieved in a fundamental frequency band by adjusting to a phase range, in which both of the MAG deviation and the DEG deviation are small. This corresponds to a case where the DEG deviation is in a range of X2, and the MAG deviation is in a range of X1 or less in FIG. 5. The ends of ranges meeting these conditions are shown by Δ in FIG. 5. As is clear from FIG. 5, the wide-band matching in a fundamental frequency band can be obtained in a range of −125° to −180° and in a range of +90° to +180°. Accordingly, wide-range phase matching can be achieved in a fundamental frequency band, by adjusting the phase $\theta_2$ of the impedance Z2 of the antenna switch module when viewed from the connection reference plane to a hatched range of −125° to +90° on the Smith chart of FIG. 6.

(b) When the phase $\theta_2$ of the impedance Z2 of the antenna switch module ASM when viewed from the connection reference plane is equal to a phase $\theta_1$ (−θ) obtained by changing the sign of the phase θ of the impedance Z1 of the high-frequency amplifier HPA in a fundamental frequency band, the insertion loss (signal attenuation) is minimum. Namely, when the phase $\theta_2$ of the impedance Z2 is equal to a phase $\theta_1$ corresponding to the conjugate impedance of the impedance Z1 in a fundamental frequency band, the insertion loss is minimum. In FIG. 7 showing the fundamental frequency band, the insertion loss is minimum at around −130°, which may be regarded as a conjugate matching position. There is a bottom at a position separate from the conjugate matching position by 180°, providing the maximum insertion loss. Because the waveform of the insertion loss shown in FIG. 7 is substantially sinusoidal, a center line between the upper and lower limits of this waveform or above may be a permissible range. Accordingly, a low insertion loss can be achieved in a fundamental frequency by adjusting the phase $\theta_2$ of the impedance Z2 to a range within $\theta_1 \pm 90°$.

In sum, (1) by adjusting the phase $\theta_2$ of the impedance Z2 to a hatched range of −125° to +90° in FIG. 6, wide-band matching in a fundamental frequency band can be achieved in a transmission band; (2) by adjusting the phase $\theta_2$ of the impedance Z2 to a range of the conjugate impedance $\theta_1 \pm 90°$, a low insertion loss can be achieved in a fundamental frequency band; and (3) by adjusting the phase $\theta_2$ of the impedance Z2 to a hatched range in FIG. 8, which is an overlap of the conjugate matching range within $\theta_1 \pm 90°$ and the range of −125° to +90°, wide-band matching and low insertion loss in a fundamental frequency band can be achieved in a transmission band.

Because impedance and its phase change with a frequency in a high-frequency circuit, it should be noted that the phase $\theta_2$ differs in a fundamental frequency band and in n-th harmonic frequency bands. Specifically, (1) the requirement that $\theta_2$ is within $\theta_0 \pm 120°$ is concerned with the range of $\theta_2$ for achieving the attenuation in n-th harmonic frequency bands (nonconjugate matching range); (2) the requirement that $\theta_2$ is within −125° to +90° is concerned with the range of $\theta_2$ for achieving wide-band matching in a fundamental frequency band; (3) the requirement that $\theta_2$ is within $\theta_1 \pm 90°$ is concerned with the range of $\theta_2$ for achieving a low insertion loss in a fundamental frequency band; and (4) the requirement that $\theta_2$ is within $\theta_1 \pm 90°$ and within $-125°$ to $+90°$ is concerned with the range of $\theta_2$ for achieving wide-band matching and a low insertion loss in a fundamental frequency band.

[2.2] Specific Examples of Relations of Expansion of Range Operable at Low Insertion Loss and Reduction of Insertion Loss in Transmission Band and Phase Adjustment With respect to the phase adjustment means for achieving the expansion of a range operable at a low insertion loss and the reduction of insertion loss in a fundamental frequency band, the following has been found.

Figure 9A:
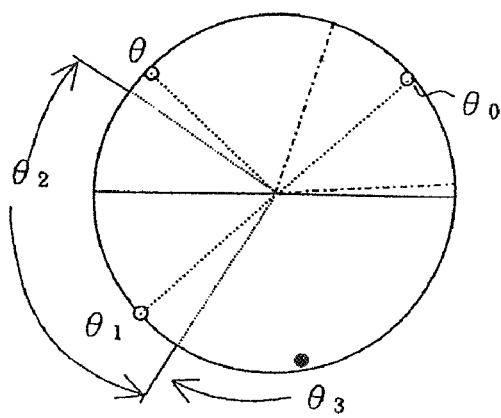
FIG. 9 (a) is a Smith chart showing one example of the procedures of a specific phase adjustment.
Figure 9B:
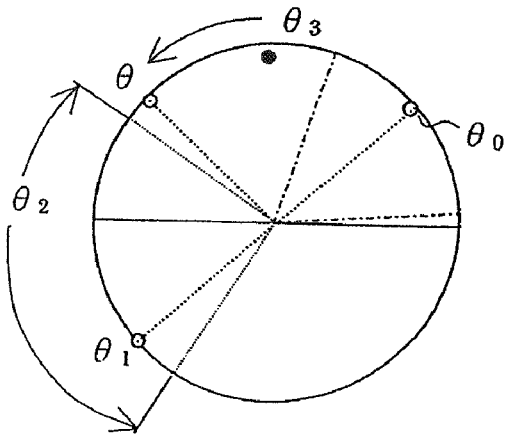

(a) When the phase $\theta_3$ of the input impedance Z3 of the antenna switch when viewed from the phase-adjusting circuit is on the counterclockwise side of $\theta_1$ on a Smith chart in a fundamental frequency band as shown in FIG. 9 (a), the transmission line is made longer such that $\theta_2$ becomes closer to the best phase $\theta_1$ than $\theta_3$. If necessary, the length and width of the transmission line L5 may also be adjusted to move $\theta_3$ in a clockwise direction toward $\theta_1$. The transmission line may be thinner. However, in that case, $\theta_3$ moves clockwise when it is on an upper half circle of the Smith chart, and counterclockwise when it is on a lower half circle of the Smith chart. Accordingly, when the transmission line is made thinner, the present position and rotation direction of $\theta_3$ on the Smith chart should be taken into consideration.

(b) When the phase $\theta_3$ is on the clockwise side of $\theta_1$ as shown in FIG. 9 (b), the transmission line is made shorter such that $\theta_2$ becomes closer to the best phase $\theta_1$ than $\theta_3$. If necessary, the length and width of the transmission line L5 may also be adjusted to move $\theta_3$ in a counterclockwise direction. The adjustment of the transmission line ASL1 is preferably to make it thicker and shorter. However, in a case where the transmission line is made thicker, on the contrary to making thinner, $\theta_3$ moves counterclockwise when it is on an upper half circle of the Smith chart, and clockwise when it is on a lower half circle of the Smith chart. Therefore, the present position and rotation direction of $\theta_3$ should also be taken into consideration.

To make adjustment in a range not satisfied by the above adjustments, or to make fine adjustment after lamination, etc., the following procedures are performed.

(c) When the phase $\theta_3$ is on the counterclockwise side of $\theta_1$, a low-pass filter constituted by the LC circuit shown in any of FIGS. 3 (a)-(d) is disposed between the terminals P0 and P1, such that $\theta_2$ becomes closer to the best phase $\theta_1$. For the purpose of phase adjustment, the capacitance of shunt C of the low-pass filter, etc. may also be adjusted. As in the phase adjustment in n-th harmonic frequency bands, one of the DC-blocking capacitors Ca1, Ca2 may be omitted. Ca1 is omitted here and shown by the dotted line. When the capacitor Ca1 on the side of the antenna switch is omitted in FIGS. 3 (b) and (d), parallel resonance is generated with the grounded transmission line L5. In this case, the transmission line L5 may be short, convenient for layout adjustment at the time of lamination.

(d) When the phase $\theta_3$ is on the clockwise side $\theta_1$, a high-pass filter constituted by the LC circuit shown in any of FIGS. 4 (a)-(d) is disposed between the terminals P0 and P1, such that $\theta_2$ becomes closer to the best phase $\theta_1$. In this case, at least one of the DC-blocking capacitors Ca1, Ca2 and the capacitor C of the LC circuit need only be left. For instance, with only the capacitor Ca2 of the high-frequency amplifier or C left, the grounded inductor L or transmission line SL is connected to the antenna switch. Thus, the phase adjustment by inserting the high-pass filter is desirable for simplifying the circuit.

[3] Reduction of Interference Between Circuits in High-Frequency Module

As a result of investigation of interference such as noises, etc. between the high-frequency amplifier and the antenna switch module part, the following has been found.

(a) Isolation between the circuits can be increased, for instance, to as large as −30 dB or less in a band of 500 MHz to 6 GHz, by disposing longitudinally aligned through-hole electrodes between adjacent circuits, thereby sufficiently suppressing mutual interference between the circuits. More effect is obtained by narrower intervals between the longitudinally aligned through-hole electrodes, though too narrow intervals result in increase in production cost, decrease in strength, etc. The intervals of the longitudinally aligned through-hole electrodes are preferably about 1 mm on average. For instance, in the case of the triple-band antenna switch, if a third harmonic having the highest frequency, which is around 5.4 GHz ($\lambda$=55.6 mm), in a DCS transmitting/receiving system is to be suppressed, sufficient suppressing effect would be able to be obtained at intervals of $\lambda/20$ or less when there are only through-holes, taking into account the wavelength of this frequency and the wavelength-shortening effect of a dielectric body. Of course, the frequency to be suppressed may be any of n-th harmonics (n is an integer of greater than 0) in a DCS/PCS system, any of n-th harmonics in a GSM system, etc. In the case of the above example, because a fundamental frequency to a third harmonic in the GSM system and a fundamental frequency to a second harmonic in the DCS/PCS system are longer in a wavelength $\lambda$ than a third harmonic in the DCS system, all of the above frequencies would be able to be suppressed if the third harmonic in the DCS system were selected as a target frequency to be suppressed. In addition, plural rows of the longitudinally aligned through-hole electrodes may be arranged in parallel, to reduce the intervals between the through-holes.

(b) With a strip-shaped shielding electrode formed on a dielectric layer, and with longitudinally aligned through-hole electrodes penetrating through dielectric layers, isolation characteristics are further improved. The effect of the strip-shaped shielding electrodes is larger when they are formed on layers above and below the dielectric layer having transmission lines, than when they are disposed between the transmission lines. Accordingly, the shielding electrodes are most preferably formed on all layers. However, they may properly be formed on upper and lower layers of those having transmission lines, or connected to ground electrodes on intermediate layers depending on the shapes of the electrode patterns and space, to obtain large isolation (shielding) effects. For instance, in the case of the triple-band antenna switch, even when a shielding electrode is formed only between the dielectric layers having transmission lines, as large isolation as −30 dB or less can be obtained by forming the through-hole electrodes at intervals of $\lambda/4$ or less of a third harmonic in the DCS transmitting/receiving system.

It is clear from the above that high isolation effects can be obtained in the high-frequency module, by disposing the strip-shaped shielding electrode between the adjacent circuits, or by forming the longitudinally aligned through-hole electrodes continuously in a lamination direction. These shielding means are effective in a limited space. Though the strip-shaped shielding electrodes are preferably formed on all dielectric layers, the strip-shaped shielding electrode may be formed at least on a dielectric layer having transmission lines, or on any layer above or below the dielectric layer having transmission lines. Most preferable is the formation of both of the strip-shaped shielding electrode and the longitudinally aligned through-hole electrodes. The ground electrodes may be used as the shielding electrodes.

With the above structure, the high-frequency parts such as the antenna switch module parts and the high-frequency amplifiers, etc. may be mounted in a limited space while suppressing mutual interference, to provide a high-frequency module.

Referring to the drawings, an example of using the high-frequency device according to one embodiment of the present invention in a cell phone system will be explained below. Generally in the cell phone system, control signals (power control signals) are sent from a base station to cell phones such that transmission outputs have the minimum power necessary for communications, to avoid radio interference with near cell phones. Gate voltage is controlled in a high-frequency amplifier at a transmission output stage by an APC (automatic power control) circuit operating based on this control signal, such that its transmission has an output level necessary for communications. The control of the gate voltage is actually carried out by comparing a detection signal obtained by monitoring a power output from the high-frequency amplifier, with a power control signal sent from the base station. Thus, in the communications system of cell phones, communications are conducted with outputs changed to be adapted to the environment, to avoid radio interference with other cell phones, thereby stably maintaining call quality.

Output-detecting circuits for the high-frequency amplifiers in the digital cell phone system in Europe are classified into two systems. One is a system detecting output power by a coupler circuit connected to the output terminal of the high-frequency amplifier, and the other is a system determining consumed power from voltage decrease measured by a resistor of about 1-10Ω mounted to the high-frequency amplifier, and converting the consumed power to a high-frequency power. Generally, the former is materialized by the formation of a circuit in a laminate, while the latter is materialized, for instance, by mounting parts onto the laminate or circuit integration to semiconductor chips.

4.1 FIRST EMBODIMENT

Figure 11:
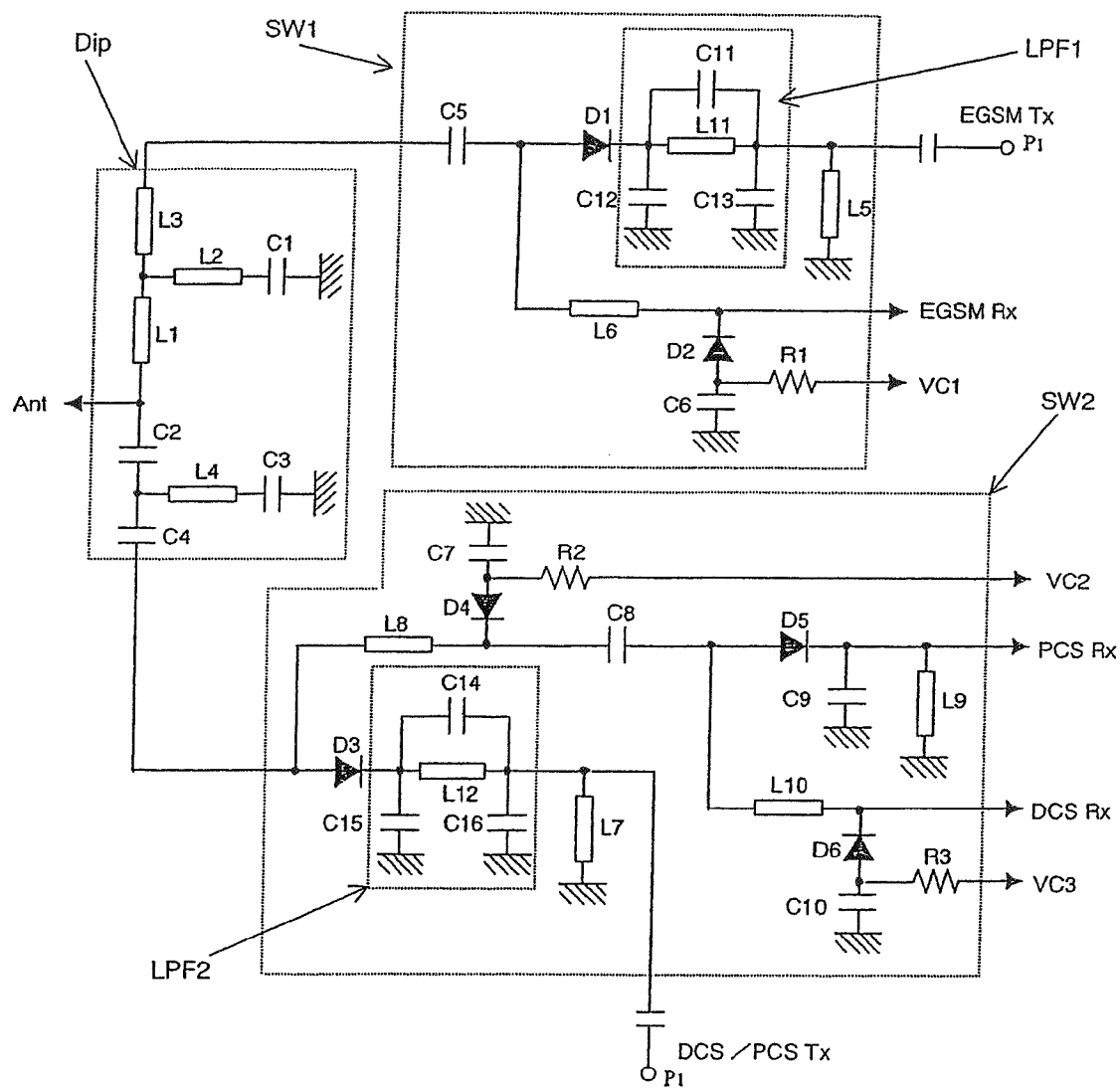
FIG. 11 is a view showing an equivalent circuit of the triple-band antenna switch module part according to one embodiment of the present invention.
Figure 17:
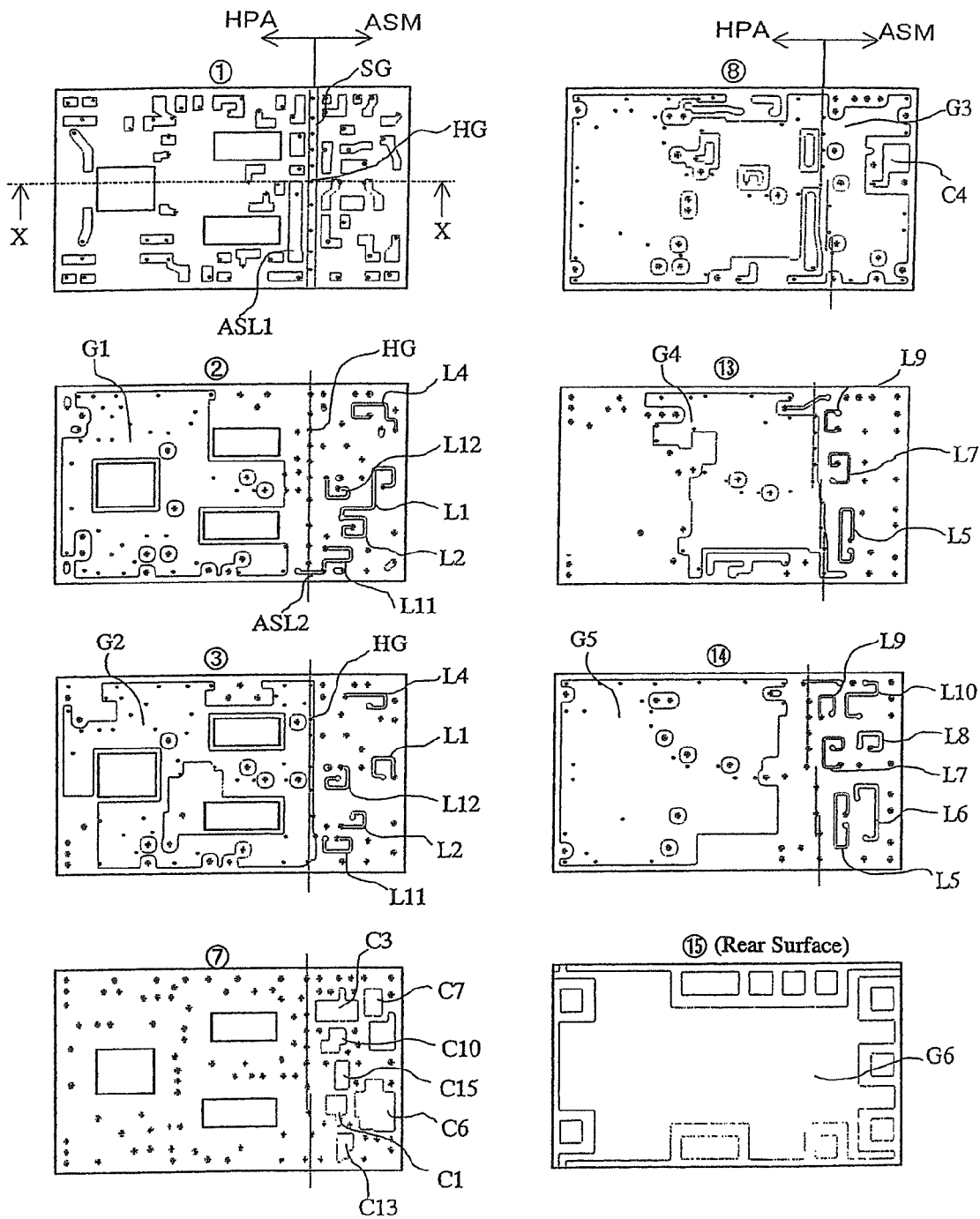
FIG. 17 is a partial development view showing the green sheets of the multiband high-frequency module laminate according to one embodiment of the present invention.
Figure 23:
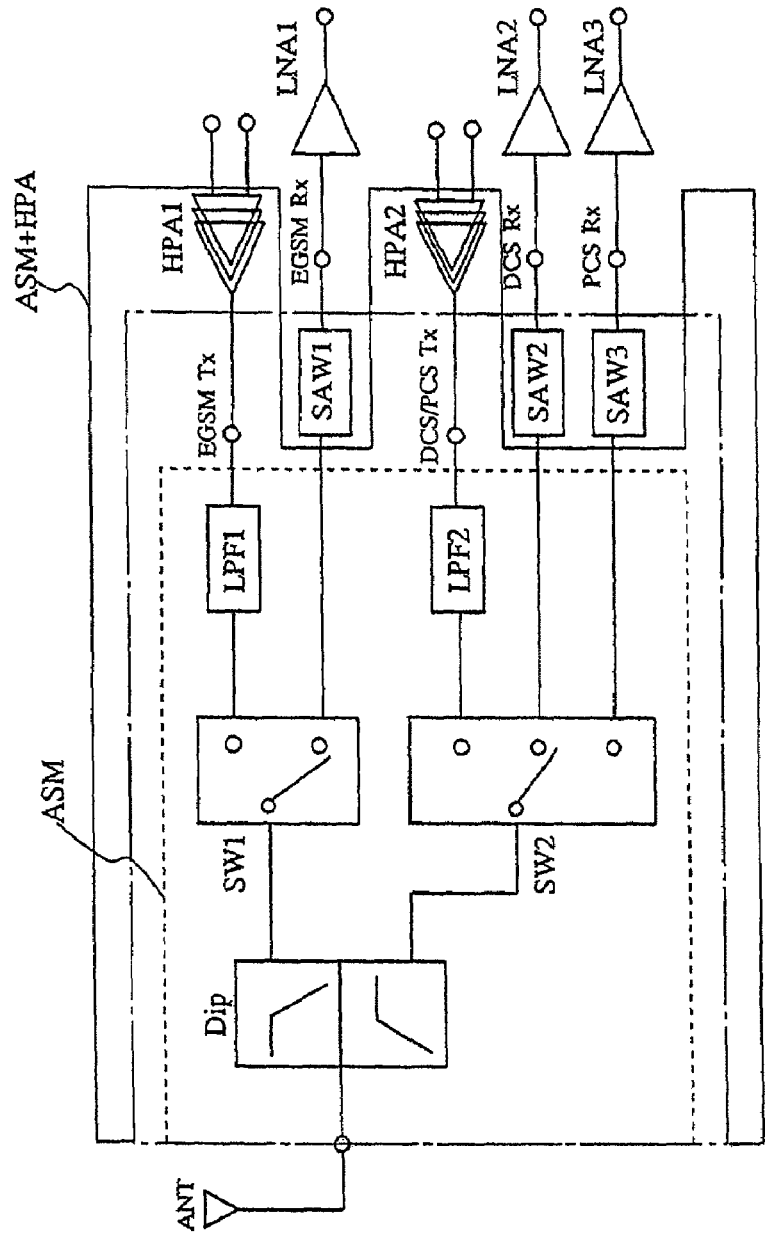
FIG. 23 is a block diagram showing the overall structures of a multiband high-frequency device and a high-frequency module.

This embodiment uses a semiconductor chip having a function of monitoring an output power. FIG. 11 shows the equivalent circuit of a triple-band antenna switch module part for EGSM, DCS and PCS. FIG. 12 shows the equivalent circuit of a high-frequency amplifier, and FIGS. 13(*a*) and (*b*) show their circuit portions near the connection points. The high-frequency module of this embodiment is constituted by apparatuses (ASM+HPA) in a range shown by the solid line in FIG. 23, which are combined in one laminate, and FIG. 17 is a partial development view showing the laminate.

(A) Diplexer (Branching Circuit)

Referring to FIG. 11, the diplexer Dip is constituted by transmission lines L1-L4 and capacitors C1-C4. The transmission line L2 and the capacitor C1 constitute a series resonance circuit designed to have a resonance frequency in a DCS band (transmission frequency: 1710-1785 MHz, receiving frequency: 1805-1880 MHz) and a PCS band (transmission frequency: 1850-1910 MHz, receiving frequency: 1930-1990 MHz). In this Example, the attenuation peak was set at 1.8 GHz. The transmission line L4 and the capacitor C3 constitute a series resonance circuit designed to have a resonance frequency in an EGSM band (transmission frequency: 880-915 MHz, receiving frequency: 925-960 MHz). In this Example, the attenuation peak was set at 0.9 GHz.

The branching and combining of an EGSM signal and a DCS/PCS signal can be conducted by this circuit. The transmission lines L1, L3 are preferably set to have such length that they have high impedance at a frequency of the DCS/PCS signal. This makes it difficult for the DCS/PCS signal to be transmitted to the EGSM line. The transmission line L3 may be omitted. The capacitors C2, C4 are preferably set to have relatively small capacitance such that they have high impedance at a frequency of the EGSM signal. This makes it difficult for the EGSM signal to be transmitted to the DCS/PCS line.

(B) Switch Circuit

The first switch circuit SW1 is constituted by capacitors C5, C6, transmission lines L5, L6, pin diodes D1, D2, and a resistor R1. The transmission lines L5, L6 are set to have such length that they constitute a λ/4 resonator in a transmission frequency band of EGSM. The transmission line L5 may be substituted by a choke coil, whose ground level is substantially open (high impedance) at a frequency of EGSM transmission. In this case, the inductance is preferably about 10-100 nH. The resistor R1 determines electric current flowing through the first and second diodes D1, D2 when the control voltage VC1 is high. In this Example, the resistor R1 was 100 Ω to 200 Ω. The capacitors C5, C6 are necessary to cut a DC component in the control voltage. Because there is parasitic inductance due to connecting wires, etc. in the pin diode D2, when the control voltage VC1 is high, series resonance is caused to occur with the capacitor C6 to eliminate the parasitic inductance. The capacitance of the capacitor C 6 may properly be set.

With the above structure, when the control voltage VC1 is high, both of the first and second diodes D1, D2 are turned on, while the connection point of the second diode D2 and the transmission line L6 is at a ground level, thereby making the impedance of the transmission line L6 (λ/4 resonator) on the opposite side infinitive. Accordingly, when the control voltage VC1 is high, a signal cannot pass through a line between the diplexer Dip and the EGSM Rx, while a signal easily passes through a line between the diplexer Dip and the EGSM Tx. On the other hand, when the control voltage VC1 is low, the first diode D1 is also turned off, so that a signal cannot pass through a line between the diplexer Dip and the EGSM Tx. Because the second diode D2 is also turned off, a signal easily passes through a line between the diplexer Dip and the EGSM Rx. It is thus possible to switch the transmitting and receiving of the EGSM signal.

The second switch circuit SW2 is constituted by capacitors C7-C10, transmission lines L7-L10, Pin diodes D3-D6, and resistors R2, R3. The transmission lines L7-L10 are set to have such length that they constitute a λ/4 resonator at a frequency of the DCS/PCS signal. The transmission lines L7, L9 may be replaced by a choke coil, whose ground level is substantially open (high impedance) at a transmission frequency of DCS. In this case, the inductance is preferably about 5-60 nH. The resistor R2 determines electric current flowing through the third and fourth diodes D3, D4, when the control voltage VC2 is high. In this Example, the resistor R2 was 100 Ω to 200 Ω. The resistor R3 determines electric current flowing through the fifth and sixth diodes D5, D6, when the control voltage VC3 is high. In this Example, the resistor R3 is 100 Ω to 2 kΩ. The capacitors C7, C8 and C10 are necessary for cutting the DC component in the control voltage. When the control voltage VC2 is high, there is parasitic inductance due to connecting wires, etc. in the pin diode D4. Accordingly, the capacitance of the capacitor C7 is set such that there is series resonance with the capacitor C7.

With the above structure, both of the third and fourth diodes D3, D4 are turned on, when the control voltage VC2 is high. Accordingly, the connection point of the fourth diode D4 and the transmission line L8 becomes a ground level, thereby making the impedance of the transmission line L8 ($\lambda/4$ resonator) on the opposite side infinitive. Accordingly, when the control voltage VC2 is high, a signal cannot pass through a line between the diplexer Dip and the PCS Rx and a line between the diplexer Dip and the DCS Rx, while a signal easily passes through a line between the diplexer Dip and the DCS/PCS Tx. On the other hand, when the control terminal VC2 is low, the third diode D3 is also turned off, so that a signal cannot pass through a line between the diplexer Dip and the DCS/PCS Tx. Because the fourth diode D4 is also turned off, a signal easily passes through a line between the diplexer Dip and PCS Rx and a line between the diplexer Dip and the DCS Rx.

When the control terminal VC3 is high, because there is a parasitic inductance due to connecting wires, etc. in the pin diode D6, the capacitance of the capacitor C10 is determined such that there is series resonance with the capacitor C10. Thus, when the control terminal VC3 is high, both of the fifth and sixth diodes D5, D6 are turned on, placing a connection point of the sixth diode D6 and the transmission line L10 on a ground level, resulting in infinitive impedance on the opposite side of the transmission line L10, a $\lambda/4$ resonator. Accordingly, when the control terminal VC3 is high, a signal cannot pass through a line between the diplexer Dip and the DCS Rx, while a signal easily passes through a line between the diplexer Dip and the PCS Rx. When the control terminal VC3 is low, the fifth diode D5 is also turned off, so that a signal cannot pass through a line between the diplexer Dip and the PCS Rx. Because the sixth diode D6 is also turned off, a signal easily passes through a line between the diplexer Dip and the DCS Rx. Thus, when the control terminal VC2 is high, switching to DCS/PCS Tx is achieved. When the control terminals VC2, VC3 are low and high, respectively, switching to PCS Rx is possible. Also, when the control terminals VC2 and VC3 are low, switching to DCS Rx is possible.

(C) Low-Pass Filter

The first low-pass filter LPF1 is a π-type low-pass filter constituted by a transmission line L11 and capacitors C11-C13. The transmission line L11 and the capacitor C11 constitutes a parallel resonance circuit with a resonance frequency set to be two to three times the transmission frequency of EGSM. In this Example, the resonance frequency was set at 2.7 GHz, which is three times the transmission frequency. With the above structure, harmonics can be removed from the transmission signal of EGSM supplied from the power amplifier. Accordingly, the insertion of the low-pass filter LPF1 into the signal-transmitting line is preferred for improved characteristics, though not indispensable. Though the first low-pass filter LPF1 is disposed between the first diode D1 and the transmission line L5 in the first high-frequency switch SW1, it may be disposed between the diplexer Dip and first high-frequency switch SW1, or between the transmission line L5 and EGSM Tx. When the grounded capacitor of the first low-pass filter LPF1 is disposed in parallel with the transmission line L5, it constitutes a parallel resonance circuit, thereby making the transmission line L5 shorter than $\lambda/4$, and thus making the inductance of the choke coil smaller.

The second low-pass filter LPF2 is a π-type low-pass filter constituted by a transmission line L12 and capacitors C14-C16. The transmission line L12 and the capacitor C14 constitute a parallel resonance circuit with a resonance frequency set to be two to three times the transmission frequency of DCS/PCS. In this Example, the resonance frequency was set at 3.6 GHz, which is two times the transmission frequency. With the above structure, harmonic strain can be removed from the transmission signal of DCS/PCS supplied from the power amplifier. Accordingly, the insertion of the low-pass filter LPF2 into the signal-transmitting line is preferred for improved characteristics, though not indispensable. Though the second low-pass filter LPF2 is disposed between the diplexer Dip and the second high-frequency switch SW2 like the first low-pass filter LPF1, it may be disposed between the transmission line L7 and the transmission terminal Tx of DCS.

In this Example, the first and second low-pass filters LPF1, LPF2 are disposed between the diode D1 and the transmission line L5, and between the diode D3 and the transmission line L7, respectively, namely in the switch circuit. This is preferable in circuit designing, though not indispensable. The low-pass filter may be disposed at an arbitrary position in a signal-transmitting line for passing a transmission signal between the diplexer and the transmission terminal.

(D) Control Logic

The above control logic of the high-frequency device (antenna switch module part) is summarized in Table 1.

TABLE 1

| Mode | VC1 | VC2 | VC3 |
| --- | --- | --- | --- |
| EGSM TX (transmission) | High | Low | Low |
| DCS/PCS TX (transmission) | Low | High | Low |
| EGSM RX (Receiving) | Low | Low | Low |
| DCS RX (Receiving) | Low | Low | Low |
| PCS RX (Receiving) | Low | Low | High |

4.2 SECOND EMBODIMENT

The EGSM system may be divided to GSM850 (transmission frequency: 824-849 MHz, receiving frequency: 869-894 MHz) and EGSM, to provide a quadruple-band, high-frequency device. In this case, the transmitting system comprises a common terminal, and the receiving system comprising a triple-band antenna switch, whose EGSM-receiving terminal is connected to a switch for switching GSM850 and EGSM. A frequency between them can be divided by a transmission line, a $\lambda/4$ resonator of a GSM850 band and an EGSM band, in place of this switch.

(A) High-Frequency Amplifier

FIG. 12 shows one example of a matching circuit in the high-frequency amplifier constituting the high-frequency device. An output terminal P0 of this matching circuit is connected, for instance, to a transmission terminal P1 of EGSM Tx in the antenna switch module of FIG. 6, to send the amplified transmission signal to the antenna switch. The output terminal P0 is connected to one end of the transmission line ASL1 via the DC-blocking capacitor Ca2. The transmission line ASL1 is connected to the grounded capacitors Ca3, Ca4, to constitute an output-matching circuit. The other end of the transmission line ASL1 is connected to a drain of a field-effect switching transistor (FET) Q1, one type of a semiconductor element. The source of FET Q1 is grounded, and the gate of FET Q1 is connected to a collector of a bipolar switching element (B-Tr) Q2.

A connection point of the other end of the transmission line ASL1 and the drain D of the field-effect switching transistor FET Q1 is grounded via a series circuit of an inductor SL1 formed by a λ/4 strip line, etc., and a capacitor Ca5, and a connection point of the inductor SL1 and the capacitor Ca5 is connected to a drain voltage terminal Vdd1. A connection point of the gate of the field-effect switching transistor FET Q1 and the collector of the bipolar switching element Q2 is grounded via a capacitor Ca6, and the gate of Q2 is connected to a voltage terminal Vg.

The emitter of the bipolar switching element Q2 is grounded, and the base of Q2 is connected to one end of the transmission line SL3. The collector of the bipolar switching element Q2 is grounded via a series circuit of an inductor SL2 formed by a strip line, etc. and a capacitor Ca7, and a connection point of the inductor SL2 and the capacitor Ca7 is connected to a collector voltage terminal Vc. A connection point of the inductor SL2 and the capacitor Ca7 is connected to a connection point of the base of the bipolar switching element Q2 and one end of the transmission lineSL3. The other end of the transmission line SL3 is grounded via a capacitor Ca8, and connected to an input terminal Pin.

In the equivalent circuits shown in FIGS. 11 and 12, transmission lines and inductors are mostly formed by strip lines, though they may be formed by microstrip lines, coplanar guidelines, etc. The amplifying circuit may be constituted as a high-power amplifier comprising three or more amplifying circuits by adding semiconductor elements Q3 and power-applying circuits. In this Example, the transistor Q1 was FET, and the transistor Q2 was B-Tr, though they may be changed to other types of transistors. For instance, Si-MOSFETs, GaAs FETs, Si bipolar transistors, GaAs HBTs (hetero-junction bipolar transistors), HEMTs (high electron mobility transistors), etc. may be used. Of course, MMICs (monolithic microwave integrated circuits), in which several transistors are integrated, may also be used. In this Example, the transmission line SL3 and the transistor Q2 are directly connected, though they may be connected via a resistor.

(B) Phase Adjustment

Figure 14:
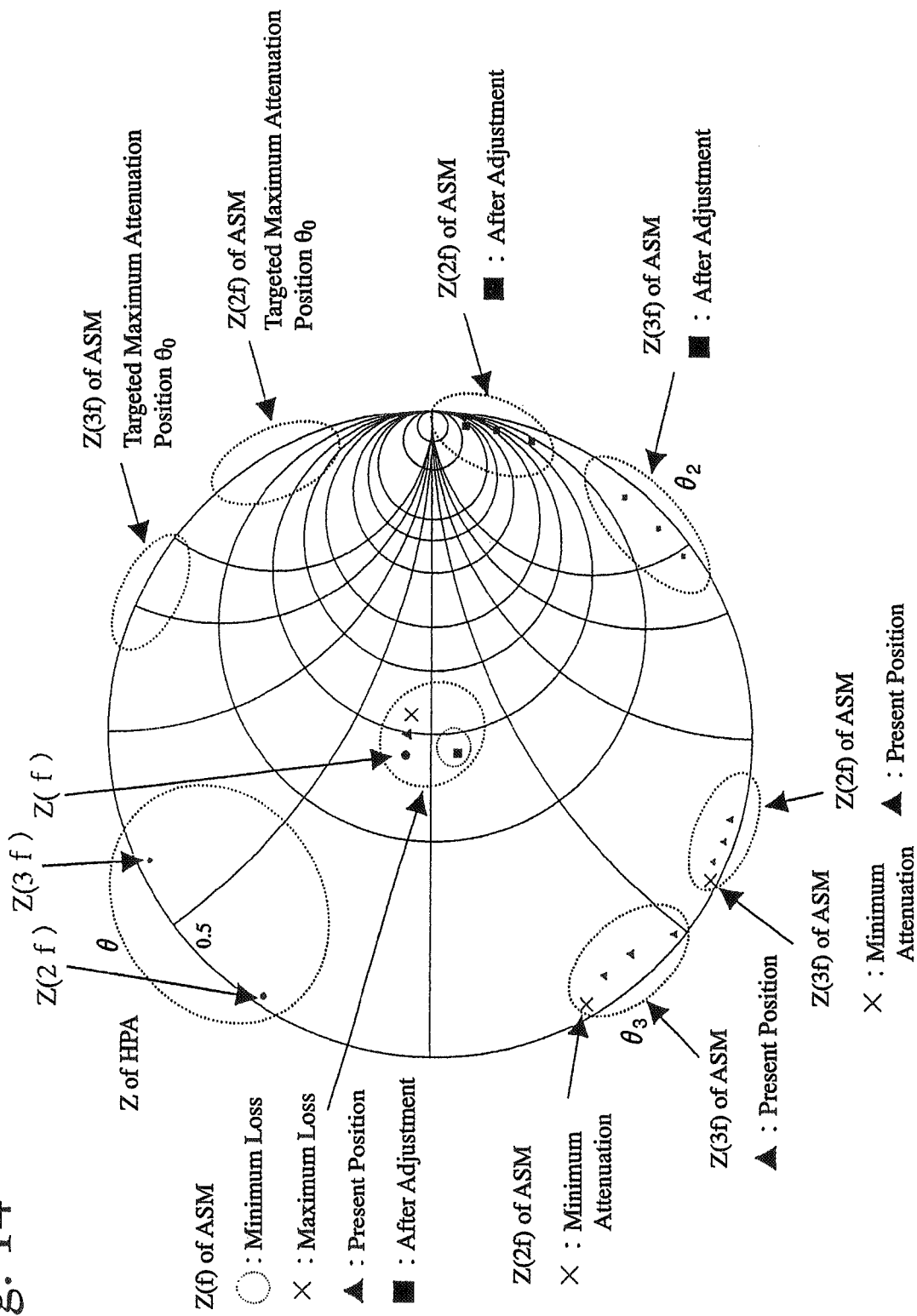
FIG. 14 is a Smith chart showing the phase adjustment when a high-pass filter is used.

FIG. 13 shows a circuit portion of a high-frequency amplifier or an antenna switch module ASM near its phase-adjusting circuit. The phase-adjusting circuit may be constituted by inserting a transmission line or an LC circuit for a high-pass filter or a low-pass filter, etc. Explanation will be made here on an example, in which the high-pass filter of FIG. 4 (*b*) is disposed between the terminals P1 and P0 of EGSM Tx. FIG. 14 is a Smith chart, in which the behaviors of a fundamental frequency (f), a second harmonic (2 f), a third harmonic (3 f) were plotted, when the impedance of the antenna switch module was adjusted with the fixed impedance of the high-frequency amplifier when viewed from the connection reference plane The phase of the power amplifier HPA is in a range of θ (upper left) in both a second harmonic (2 f) and a third harmonic (3 f). For instance, by adjusting the length of the transmission line ASL1 and the capacitance of the capacitor in the output matching circuit from this state toward a conjugate matching relation, the impedance of the antenna switch module part ASM is conjugate-matched to an impedance near the standard impedance (50 Ω) in a fundamental frequency (f) (shown by the mark ■ in a circle of the dotted line substantially at center in FIG. 14)

The present phases $\theta_3$ of the impedances of a second harmonic (2 f) and a third harmonic (3 f) are in ranges of the conjugate matching phases $\theta_1$ (shown by the mark ▲ at lower left in FIG. 14). For instance, by inserting a high-pass filter constituted by an inductor of 18 nH and a capacitor of 6 pF, the phase $\theta_2$ moves to a range shown by the mark ■ at lower right in FIG. 14. In this Example, $\theta_2$ can be adjusted to a range of $\theta_0$–90° near the targeted range of $\theta_0$ in the second harmonic (2 f), and to a range of $\theta_0$–120° in the third harmonic (3 f). By further phase adjustment, $\theta_2$ can be moved to a range of $\theta_0$ (upper right), at which the maximum attenuation can be achieved.

Though the adjusted phase and direction may differ on a case-by-case basis, the basic principle of the present invention is that the second harmonic (2 f), a main component of unnecessary harmonics, is predominantly adjusted to make $\theta_2$ closer to $\theta_0$. In some cases, only the adjustment of $\theta_2$ may be conducted, sacrificing the adjustment of the third harmonic (3 f).

Figure 15A:
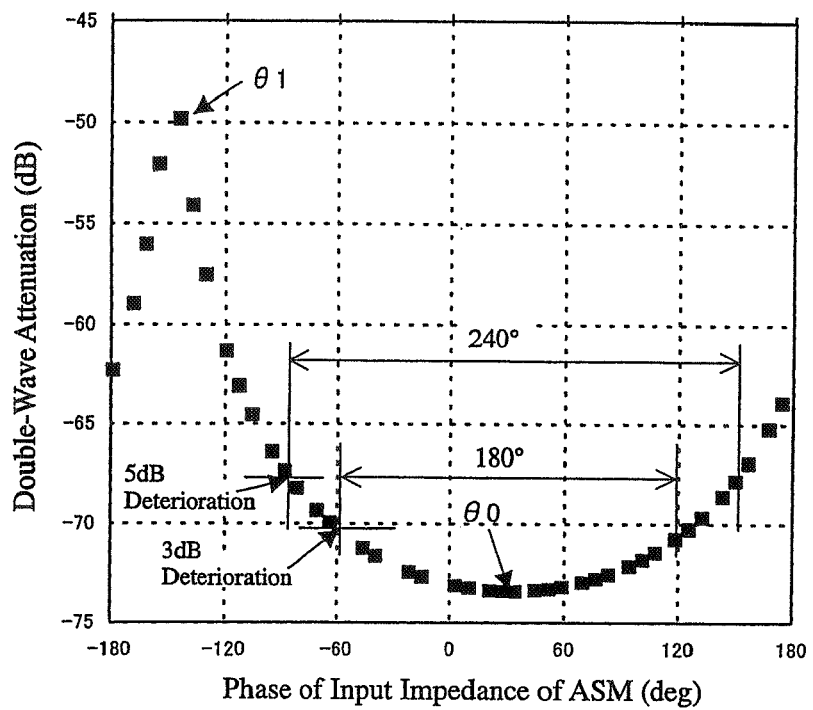
FIG. 15 (a) is a graph showing the relation between the input phase of ASM and second harmonic attenuation.
Figure 15B:
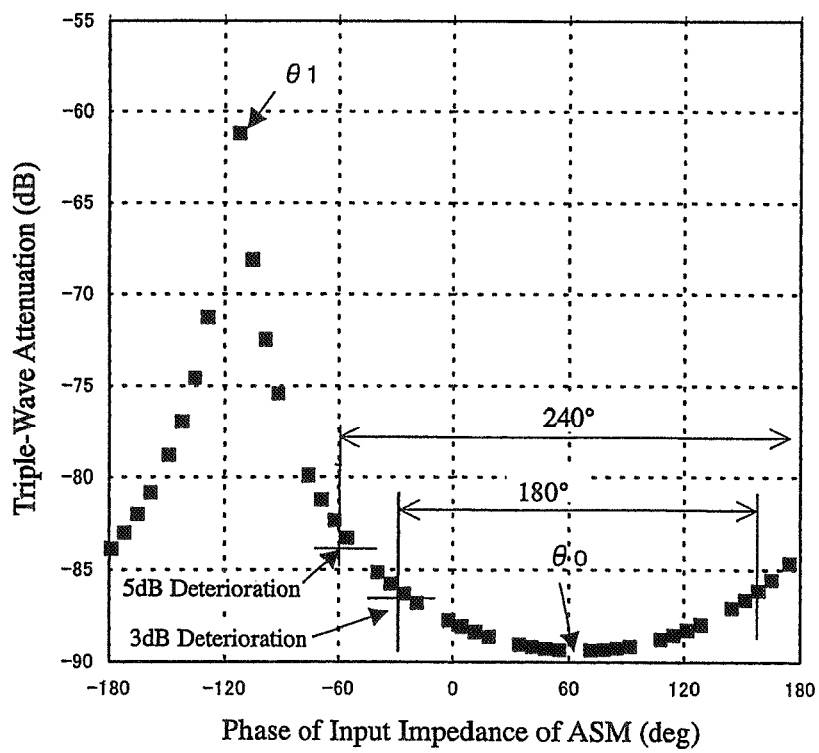

The relations between the input phase of ASM and the attenuation of the second harmonic (2 f) and the third harmonic (3 f) in EGSM (880-960 MHz) are shown in FIGS. 15(*a*) and (*b*), respectively. In FIG. 15(*a*), the phase $\theta_0$ providing the maximum attenuation [−73 dB] is around 30°. Though the optimum would be to adjust to this phase, there is a permissible range in actual designing. For instance, a range permitting the deterioration of the attenuation by about 3 dB is 180° ($\theta_0 \pm 90°$), and a range permitting the deterioration of the attenuation by about 5 dB is 240° ($\theta_0 \pm 120°$). This is true of the attenuation characteristics of the third harmonic shown in FIG. 15(*b*). In fact, the attenuation of −70 dB or more can be achieved even with 3 dB of deterioration, and the attenuation of −65 dB or more can be achieved even with 5 dB of deterioration. It is thus clear that sufficient effects can be obtained by the adjustment within ±120° of the best phase $\theta_0$. The phase control range is preferably $\theta_0 \pm 90°$, more preferably $\theta_0 \pm 45°$. In the DCS/PCS system, too, the same phase range can provide the effect of the present invention.

(C) Power-Adding Efficiency

Figure 16:
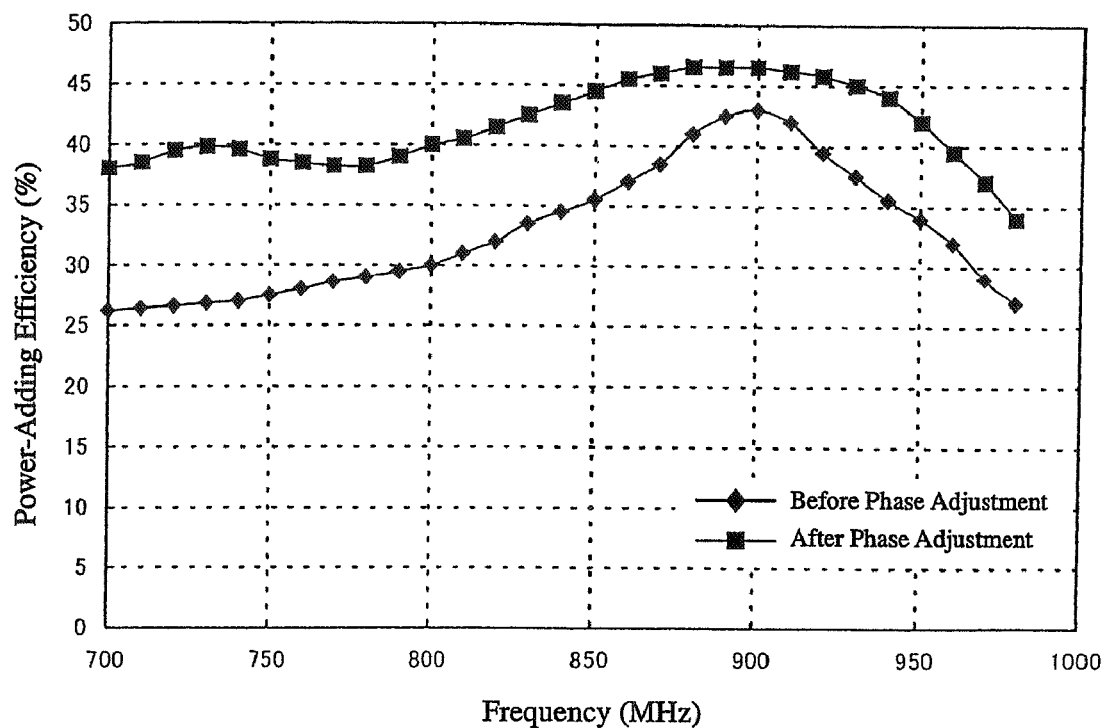
FIG. 16 is a graph showing the relation between frequency and power-adding efficiency.

With respect to a power-adding efficiency important as the transmission characteristics, the present invention exhibits a remarkable effect of expanding a range operable at a low insertion loss. FIG. 16 shows the relation between frequency and the power-adding efficiency before and after the phase adjustment in a transmission band of EGSM. Before the phase adjustment, the power-adding efficiency had a low and steep peak with a narrow width, resulting in extremely large loss. On the contrary, after the phase adjustment, the peak value of the power-adding efficiency drastically increased, with a smooth and wide waveform near the peak, resulting in a low insertion loss.

In the phase adjustment of this example, a high-pass filter constituted by an inductor of 18 nH and a capacitor of 6 pF was inserted. The Smith chart of FIG. 14 shows the positions of impedance in a fundamental frequency, a second harmonic and a third harmonic, before and after the insertion of the high-pass filter. The fundamental frequency is positioned at a center of the chart. The phase $\theta_1$ corresponding to the conjugate matching phase of the fundamental frequency is around −130°. After the insertion of the high-pass filter, $\theta_2$ moved to around ($\theta_1$–10°), resulting in adjustment to an extremely effective position.

With respect to the n-th harmonics, 2 f could be adjusted to a range within $\theta_0$–90°, and 3 f could be adjusted to a range within $\theta_0$–120°, which is closer to the targeted $\theta_0$. Even though HPA and ASM with optimized characteristics are used, only the power-adding efficiency of a low level can be obtained before the phase adjustment as shown in FIG. 16. However, the phase relation could be optimally adjusted by inserting the phase-adjusting circuit, resulting in a high-level power-adding efficiency in a wide range. Such effects are obtained in the DCS/PCS system, too.

4.3 THIRD EMBODIMENT

High-Frequency Module

FIG. 17 is a development view showing green sheets in upper first to third layers, intermediate seventh to eighth layers and lower thirteenth to fifteenth layers, in a high-frequency module containing the antenna switch module part having the equivalent circuit of FIG. 11 and the high-frequency amplifier part having the equivalent circuit of FIG. 12 in one laminate. The laminate is constituted by 15 dielectric green sheets, with a dielectric green sheet 1 as an uppermost layer and a dielectric green sheet 15 as a lowermost layer.

The dielectric green sheets are made of low-temperature cofirable ceramics (LTCC) sinterable at a low temperature of 950° C. or lower. For instance, a dielectric composition comprising 10-60% by mass of Al (converted to $Al_2O_3$), 25-60% by mass of Si (converted to $SiO_2$), 7.5-50% by mass of Sr (converted to SrO), 20% by mass or less of Ti (converted to $TiO_2$), 0.1-10% by mass of Bi (converted to $Bi_2O_3$), 0.1-5% by mass of Na (converted to $Na_2O$), 0.1-5% by mass of K (converted to $K_2O$), 0.01-5% by mass of Cu (converted to CuO), and 0.01-5% by mass of Mn (converted to $MnO_2$) may be used.

To form transmission lines and capacitors easily, the green sheet preferably has a thickness of 40-200 μm. In this Example, silver electrode materials were used. Transmission lines and capacitors are formed by an electrode pattern on each green sheet with proper through-holes. The green sheets provided with transmission lines and capacitors were successively laminated and sintered at 950° C., to provide a laminate module comprising a combination of high-frequency parts. The size of the laminate is, for instance, 13.75 mm in length×8 mm in width×0.75 mm in height. Chip elements such as diode, transistors, chip inductors, chip capacitors, resistors, etc. are mounted onto an upper surface of the laminate, and the laminate is covered with a metal casing (not shown) to provide a finished product. The total height of the finished product is about 1.8 mm. In place of the metal casing, a resin-sealed package may be used. In this case, the total height is about 1.5 mm. In another example, the size of the laminate is 10 mm in length×8 mm in width×0.75 mm in height. In this case, the total height of the finished product is about 1.8 mm in the case of a metal casing, and about 1.5 mm in the case of a resin-sealed package.

(A) Switch Module Part

The switch module part comprises transmission lines L1, L2, L3 (omitted in this Example) L4, etc. formed on the upper layer of the laminate for constituting a diplexer and low-pass filters, capacitors C1, C3, C6, C10, etc. formed on intermediate layers for constituting a diplexer, switch circuits and low-pass filters, and transmission lines L5, L6, L7, L8, L9, L10, etc. formed on lower layers for constituting switch circuits.

(B) High-Frequency Amplifying Circuit Module Part

In the high-frequency amplifying circuit module part, upper layers are provided with transmission lines for a first-stage matching circuit, intermediate layers are provided with capacitors for first-stage and last-stage matching circuits, and lower layers are provided with transmission lines for thermal vias and the last-stage matching circuit and voltage-applying lines. Ground electrodes G1, G2, G3, G4, G5, G6 are formed on the second, third, eighth, thirteenth, fourteenth, and fifteenth layers. Though the omission of the intermediate layers results in the failure of showing all of the ground electrodes, the transmission lines and the capacitors in FIG. 17, it should be noted that they are formed by electrode patterns substantially in an arrangement described above. Parts mounted onto the laminate and the circuit board are diodes D1-D6, transistors Q1-Q3, chip capacitors C5, C8, Ca5-Ca7, resistors R1-R3, etc.

(C) Phase-Adjusting Circuit

Though there is a connection point of the high-frequency amplifying circuit module part and the antenna switch module part on the upper layers, a transmission line ASL1 (line for the high-frequency amplifier) on the green sheet 1, a transmission line ASL2 (connecting line for the antenna switch module part) on the green sheet 2 are arranged at such a position that they do not overlap in a lamination direction, to avoid mutual interference. In this Example, a high-pass filter for phase adjustment exists between them, the LC circuit of this high-pass filter being formed by a chip inductor and a chip capacitor and mounted onto the upper surface of the laminate. This structure desirably permits adjustment after the production of the laminate module, saving time in trail manufacture and adjustment. In addition, because the transmission lines ASL1, ASL2 are formed on different layers at a position causing no interference, interference can be avoided between both high-frequency parts.

A shielding electrode SG is formed between ASL1 and the antenna switch module part ASM in the first layer, and a circuit pattern on the side of an antenna than the low-pass filter is formed in an ASM region. If there were electromagnetic coupling between ASL1 and this circuit pattern, unnecessary high-frequency electric power would be output from the antenna without passing through the low-pass filter. In this Example, by separating ASL1 from ASM by the shielding electrode SG, the above electromagnetic coupling can be avoided, resulting in improved high-frequency characteristics.

(D) Shielding Structure

In all green sheets constituting the composite laminate module shown in FIG. 17, electrode patterns constituting the high-frequency amplifiers are formed in a left region, while electrode patterns constituting the antenna switch module part are formed in a right region. Further, there is a strip-shaped shielding electrode SG formed between the left and right regions on the first layer, and through-hole electrodes HG penetrating all green sheets from the shielding electrode SG are longitudinally aligned. The through-hole electrodes HG are connected to a ground electrode G2 on the third layer from the shielding electrode SG, a ground electrode G3 on the eighth layer, a ground electrode G4 on the 13-th layer, and a ground electrode G6 on the lowermost layer, exhibiting effects not only in the suppression of the mutual interference between both high-frequency parts, but also in the suppression of the mutual interference between the electrode patterns arranged in a lamination direction. When there is enough room dimensionally, strip-shaped shielding electrodes SG are preferably formed on all green sheets. However, because it is impossible in many cases, the ground electrodes connected to the shielding electrode SG via the through-hole electrodes HG are utilized as shielding electrodes. The shielding electrode and the ground electrodes are preferably formed on a green sheet provided with electrode patterns for transmission lines or on any green sheets above or below that green sheet.

The intervals G of the longitudinally aligned through-hole electrodes HG are preferably as small as possible. Specifically, they should be ¼ or less of the wavelength λ of the highest frequency whose interference should be prevented. However, it has been found that the intervals G may practically be substantially about λ/10 to λ/50, taking into account the effect of suppressing mutual interference, the mechanical strength of green sheets, the easiness of forming through-holes, etc. The intervals G of the through-hole electrodes HG may be uniform or nonuniform. In this Example, the intervals were nonuniform within a range of about λ/20 (substantially 1 mm) to about λ/25 of a third harmonic (around 5.4 GHz) in the DCS band.

The through-holes are not necessarily aligned on a straight line, but may properly be deviated from a linear alignment taking into account the arrangement of electrode patterns, etc, as seen, for instance, in the seventh layer and lower layers in FIG. 17. For instance, a plurality of rows of the longitudinally aligned through-hole electrodes are disposed in parallel. In this case, the rows of the through-hole electrodes are preferably positioned such that intervals are small between the through-holes in adjacent rows to obtain a high shielding effect.

The through-hole electrodes HG longitudinally aligned at predetermined intervals increase the adhesion of the green sheets.

In the high-frequency module having the above structure, mutual interference such as noises, etc. is suppressed between the high-frequency parts by the shielding effect of the shielding electrodes SG, the through-hole electrodes HG and the ground electrodes, thereby making it possible to prevent the unstable operation such as oscillation, etc. of the high-frequency amplifier. In addition, the generation of spurious signals can be suppressed, thereby preventing the deterioration of pass characteristics. Further, because a plurality of the high-frequency parts are integrated in one laminate, a mounting area on a printed circuit board in a cell phone can be reduced by 25% to 50%, as compared with a conventional case where power amplifiers and antenna switches are separately mounted onto a board. Therefore, the high-frequency module of the present invention is suitable for communications devices mounted in small information terminals such as cell phones, PDA, etc.

The integration of the high-frequency amplifier HPA and the antenna switch module part ASM in one laminate shortens lines connecting them, resulting in decrease in line loss and matching deviation. In addition, wiring conventionally necessary for connecting them on a printed circuit board has become unnecessary. Further, the integration of the high-frequency amplifier HPA and the antenna switch module part ASM can optimize impedance matching between them, thereby simplifying a matching circuit conventionally disposed in each of HPA and ASM. Thus, the present invention provides a small high-frequency module having a low insertion loss, a high output power and high output efficiency.

Though the characteristics at the time of GSM transmission were conventionally about 35% of efficiency, about −25 dBm of second harmonic attenuation, and about −25 dBm of third harmonic attenuation, they have been improved to 43% or more of efficiency, −38 dBm or less of second harmonic attenuation, and −36 dBm or less of third harmonic attenuation in this example. At the time of DCS/PCS transmission, 34% or more of efficiency, −38 dBm or less of second harmonic attenuation, and −36 dBm or less of third harmonic attenuation have been achieved. This indicates that the present invention is effective not only in the GSM band but also in the DCS/PCS band.

As described above, the use of the high-frequency module of the present invention with improved characteristics for cell phones can improve their efficiency by about 5-10% than a conventional case where discrete high-frequency parts are mounted. This results in decreased power consumption at the time of transmission, thereby increasing call time per one charge of the battery by about 10-20%.

In addition, the high-frequency module of the present invention makes it unnecessary to conduct various conventional works, such as the combination of plural types of high-frequency amplifiers and antenna switch modules for evaluation, and the formation of matching circuits, harmonic filters, etc. on a printed circuit board, to obtain the desired characteristics.

4.4 FOURTH EMBODIMENT

FIG. 11 shows one example of the equivalent circuit of the antenna switch, and FIG. 12 shows one example of the circuit equivalent of the high-frequency amplifier. For instance, pin diodes are used in the switch circuit, though they may be replaced by GaAs switches of SPnT types, such as SPDT (single pole dual throw), SP3T, etc. The replacement of the pin diode switches with the SPDT GaAs switches makes λ/4 lines necessary for the pin diode switches unnecessary, leaving the laminate with enough space. Thus, the elimination of the space and the formation of new function elements can be made, advantageous in further miniaturization and higher integration.

Taking a triple-band antenna switch for example, the replacement of the pin diodes with the SP5 T GaAs switch enables the switching of all lines. In addition, several λ/4 lines become unnecessary, thereby enabling further miniaturization and higher integration. A low-pass filter on the transmission side and filters disposed for obtaining satisfactory characteristics can be formed in the laminate and/or constituted by parts mounted onto the laminate. In this case, because the GaAs switch is directly connected to the antenna, the GaAs switch is preferably provided with an electrostatic surge-suppressing means. When using a GaAs switch with no electrostatic surge-suppressing means, a surge-suppressing circuit such as an LC filter, etc. should be disposed between the antenna and the GaAs switch.

Figure 18:
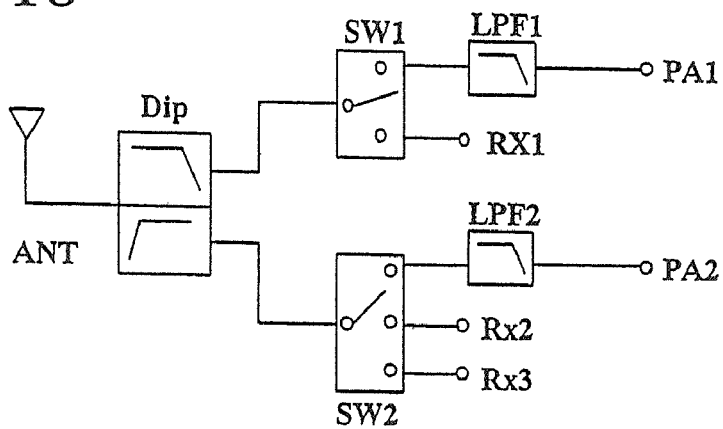
FIG. 18 is a block diagram showing one example of a triple-band antenna switch module part comprising GaAs switches.
Figure 19:
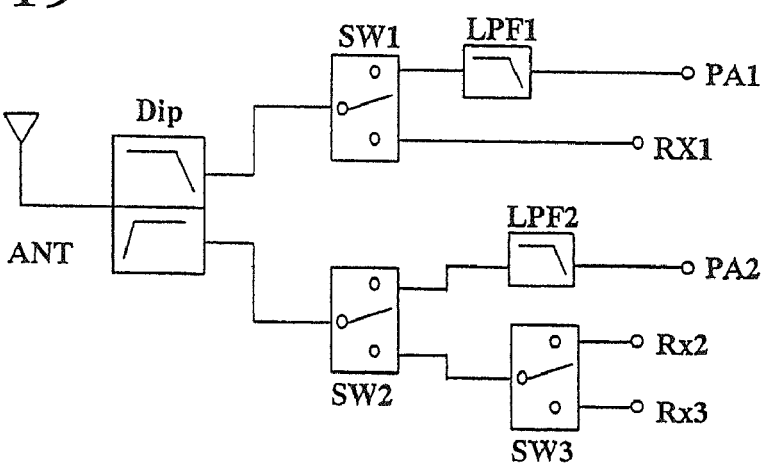
FIG. 19 is a block diagram showing another example of a triple-band antenna switch module part comprising GaAs switches.
Figure 20:
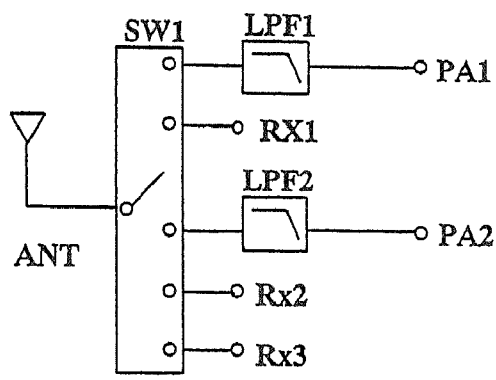
FIG. 20 is a block diagram showing a still further example of a triple-band antenna switch module part comprising a GaAs switch.

FIGS. 18-20 show triple-band antenna switch module parts each comprising GaAs switches. To integrate the antenna switch module part ASM shown in FIGS. 18-20 with the high-frequency amplifier HPA, ASM in the block diagram of FIG. 23 need only be replaced by any one of ASMs shown in FIGS. 18-20.

The antenna switch module part shown in FIG. 18 comprises an SPDT (SP2T) switch SW1 and an SP3T switch SW2. For instance, a lower frequency EGSM band and a higher-frequency DCS/PCS band are branched by a diplexer Dip. Transmission (connected to PA1) and receiving (RX1) in the EGSM band are switched by a switch SW1, and three lines of DCS/PCS transmission (connected to PA2), DCS receiving (RX2) and PCS receiving (RX3) in the DCS/PCS band are switched by a switch SW2.

The antenna switch module part shown in FIG. 19 comprises only three SP2T switches. Like in the above, a lower-frequency EGSM band and a higher-frequency DCS/PCS band in the communications system are branched by the diplexer Dip. Transmission (connected to PA1) and receiving (RX1) in the EGSM band are switched by a switch SW1;

DCS/PCS transmission (connected to PA2) and DCS/PCS receiving in a DCS/PCS band are switched by a switch SW2, and DCS receiving (RX2) and PCS receiving (RX3) are switched by a switch SW3.

The antenna switch module part shown in FIG. 20 comprises an SP5T switch for switching all lines without using a diplexer Dip.

Incidentally, the GaAs SPDT switches may properly be replaced by SPDT switches having pin diodes, in the antenna switch module parts shown in FIGS. 18 and 19. In the antenna switch module part comprising GaAs switches, too, like in the case of using the pin diodes, the above phase-adjusting circuit can provide the phase of the high-frequency amplifier HPA and the phase of the antenna switch module part ASM with conjugate matching in a passband, and with nonconjugate matching in an unnecessary harmonic band, thereby improving the characteristics of the entire high-frequency module part. Further, it is possible to provide an integrated module part comprising an APC circuit for controlling the gate voltage of an output transistor based on a detection signal of the above output-detecting means.

4.5 FIFTH EMBODIMENT

The high-frequency module of the present invention may comprise a coupler circuit and an isolator circuit between the antenna switch module part and the high-frequency amplifier, with SAW filters inserted into the lines of the receiving system. In the above example, the semiconductor chip of the high-frequency amplifier is provided with a function of monitoring an output power.

Figure 21:
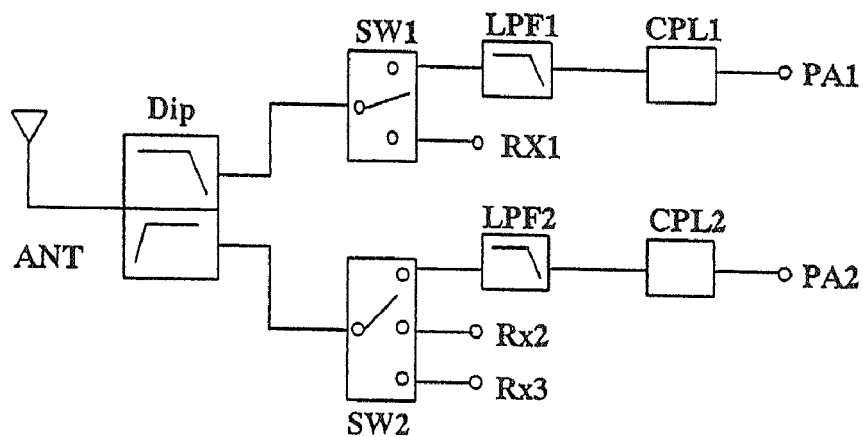
FIG. 21 is a block diagram showing a triple-band antenna switch module part comprising a coupler circuit between an antenna switch module part and a high-frequency amplifier.
Figure 22:
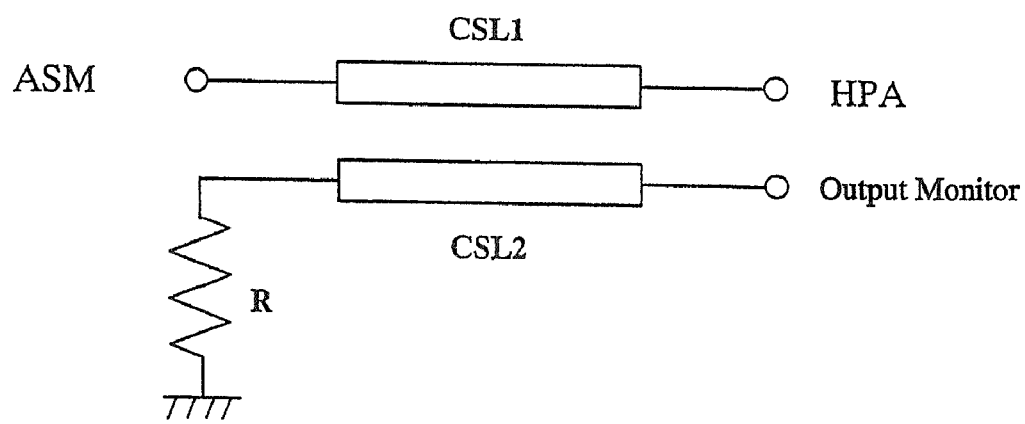
FIG. 22 is a view showing one example of the circuit of the coupler.

As shown in FIGS. 21 and 22, the electric power can be detected by the coupler circuit. As shown in FIG. 21, the coupler CPL is disposed between the low-pass filter LPF and the high-frequency amplifier PA in the antenna switch module part. In FIG. 22, a transmission line CSL1 for a high-frequency output power sent from the high-frequency amplifier HPA is called "main line," and a transmission line CSL2 for taking out part of the output power is called "coupling line." One end of the coupling line CSL2 is connected to an output monitor (detector) for the output power control of the high-frequency amplifier HPA. The other end of the coupling line CSL2 is terminated with a resistor R. Though the terminal resistor is generally 50 Ω, it may be changed properly for the adjustment of coupling and isolation.

In the structure in which the coupler is disposed between the high-frequency amplifier HPA and the antenna switch module part ASM, the relative phases of the high-frequency amplifier HPA and the antenna switch module part ASM are not adjusted, but the relative phases of the high-frequency amplifier HPA and the coupler CPL are adjusted by the phase-adjusting circuit. Specifically, their phases are adjusted to conjugate matching in a passband, while they are adjusted in a nonconjugate matching range in an unnecessary harmonic band. The coupler CPL and the antenna switch module part ASM are integrally designed to obtain the desired characteristics. The relative phases of the coupler CPL and the antenna switch module part ASM are also adjusted to conjugate matching in a passband, while they are adjusted in a nonconjugate matching range in an unnecessary harmonic band.

Loss by the coupler CPL is usually about 0.2-0.3 dB. However, with the high-frequency amplifier HPA, the coupler circuit CPL and the antenna switch module part ASM optimally designed in one laminate, miniaturization can be achieved by 25-50% with efficiency improvement by about 2-7%, as compared with conventional designs in which each circuit is separately mounted onto a printed circuit board. This saves power consumption at the time of transmission, thereby making call time per one battery charge longer, for instance, by about 5-15%. It is also possible to provide an integrated module comprising an APC circuit for controlling the gate voltage of the output transistor based on a detection signal of the coupler CPL.

[5] Other Transmitting/Receiving System

In addition to those described above, the transmitting/receiving systems, to which the present invention is applicable, include multiband antenna switch modules (dual-band, triple-band, quadruple-band, quintuple-band, etc.) for combinations of some of PDC800 band (810-960 MHz), GPS band (1575.42 MHz), PHS band (1895-1920 MHz), Bluetooth band (2400-2484 MHz), CDMA2000 expected to spread in the U.S., TD-SCDMA expected to spread in China, etc.

APPLICABILITY IN INDUSTRY

The present invention provides multiband high-frequency composite parts with a minimized insertion loss in a necessary fundamental frequency band and a maximized harmonic attenuation in an unnecessary frequency band, thereby having a low loss, a high power-adding efficiency and excellent antenna output characteristics. The use of the multiband high-frequency composite parts of the present invention provides low-cost, small and light, multiband high-frequency modules with two or more functions integrated in one laminate. By using the multiband high-frequency module of the present invention, communications devices such as high-performance cell phones, etc. can be obtained.

What is claimed is:

1. A high-frequency device comprising a circuit for switching connection to an antenna side circuit and a predetermined transmitting system circuit or receiving system circuit and a high-frequency amplifying circuit connected to said switch circuit, wherein a phase relation between said switch circuit and said high-frequency amplifying circuit is in a state corresponding to a conjugate matching in a fundamental frequency band, while it is in a state corresponding to a nonconjugate matching in n-th frequency bands, wherein n is an integer of 2 or more, and wherein a phase adjustment is carried out so that a phase of an impedance $Z_2$ in said n-th frequency bands of said switch circuit when viewed from a connection reference plane between said switch circuit and said high-frequency amplifying circuit is within $\theta_0 \pm 120°$, wherein $\theta_0 (\theta_1 \pm 180°$: a position symmetrical with respect to a center on a Smith chart) is a phase opposite to a phase $\theta_1$ by 180°, and $\theta_1$ ($-\theta$) is conjugate to a phase $\theta$ of an impedance $Z_1$ in said n-th frequency bands of said high-frequency amplifying circuit when viewed from said connection reference plane.

2. The high-frequency device according to claim 1, wherein said high-frequency amplifying circuit comprises at least a semiconductor element, a power-applying circuit and a matching circuit, said phase adjustment being carried out by adjusting a transmission line used in said matching circuit on the output terminal side of said high-frequency amplifier.

3. The high-frequency device according to claim 1, wherein said switch circuit comprise at least a switching element and a transmission line, said phase adjustment being carried out by adjusting said transmission line used on the transmission terminal side of said switch circuit.

4. The high-frequency device according to claim 1, wherein said phase adjustment is carried out by adjusting said transmission line connected to the ground on the transmission terminal side of said switch circuit and/or by adjusting a capacitance of the capacitor(s) connected to the ground on the transmission terminal side of a low-pass filter provided in said switch circuit.

5. The high-frequency device according to claim 1, wherein a phase-adjusting circuit is disposed between said switch circuit and said high-frequency amplifying circuit.

6. The high-frequency device according to claim 5, wherein said phase-adjusting circuit is an LC circuit.

7. The high-frequency device according to claim 1, wherein said switch circuit comprises a branching circuit for branching higher-frequency signals and lower-frequency signals.

8. The high-frequency device according to claim 1, wherein a coupler circuit is either connected between said high-frequency amplifier and said switch circuit or constituted in place of said switch circuit.

9. The high-frequency device according to claim 1, said high-frequency device being between a plurality of transmitting/receiving systems having different passbands and an antenna.

10. A high-frequency module comprising a switch circuit module part comprising at least one switch circuit for switching connection to an antenna side circuit and a predetermined transmitting system circuit or receiving system circuit and a high-frequency amplifying circuit connected to said switch circuit module part so as to be used between a plurality of transmitting/receiving systems having different passbands and an antenna, wherein a switching element of said switch circuit module part and a semiconductor element used for said high-frequency amplifying circuit are mounted onto a laminate having electrode patterns formed on dielectric layers constituting said laminate, at least part of said switch circuit module part and/or said high-frequency amplifying circuit being constituted by said electrode patterns formed in said laminate, wherein a phase relation between said switch circuit module part and said high-frequency amplifying circuit is in a state corresponding to a conjugate matching in a fundamental frequency band, while it is in a state corresponding to a nonconjugate matching in n-th frequency bands, wherein n is an Integer of 2 or more, and wherein a phase adjustment is carried out so that a phase of an impedance $Z_2$ in said n-th frequency bands of said switch circuit when viewed from a connection reference plane between said switch circuit and said high-frequency amplifying circuit is within $\theta_0 \pm 120°$, wherein $\theta_0(\theta_1 \pm 180°$: a position symmetrical with respect to a center on a Smith chart) is a phase opposite to a phase $\theta_1$ by 180°, and $\theta_1$ $(-\theta)$ is conjugate to a phase $\theta$ of an impedance $Z_1$ in said n-th frequency bands of said high-frequency amplifying circuit when viewed from said connection reference plane.

11. The high-frequency module according to claim 10, wherein said high-frequency amplifying circuit comprises at least a semiconductor element, a power-applying circuit and a matching circuit, and at least part of a transmission line and an LC circuit constituting said power-applying circuit and said matching circuit are formed by said electrode patterns in said laminate, said phase adjustment being carried out by adjusting said transmission line used in said matching circuit on the output terminal side of said high-frequency amplifier.

12. The high-frequency module according to claim 10, wherein said switch circuit module part comprises at least a switching element and a transmission line, and at least part of said transmission line is formed by said electrode patterns in said laminate, said phase adjustment being carried out by adjusting said transmission line used on the transmission terminal side of said switch circuit module part.

13. The high-frequency module according to claim 10, wherein said phase adjustment is carried out by adjusting said transmission line connected to the ground on the transmission terminal side of said switch circuit module part and/or by adjusting a capacitance of the capacitor(s) connected to the ground on the transmission terminal side of a low-pass filter provided in said switch circuit module part.

14. The high-frequency module according to claim 10, wherein a phase-adjusting circuit is disposed between said switch circuit and said high-frequency amplifying circuit.

15. The high-frequency module according to claim 14, wherein said phase-adjusting circuit is an LC circuit, and at least part of said LC circuit is constituted by said electrode patterns formed in said laminate.

16. The high-frequency module according to claim 10, wherein said switch circuit module part comprises a branching circuit for branching higher-frequency signals and lower-frequency signals and at least one switch circuit for switching connection to a transmitting system and a receiving system, wherein said branching circuit is constituted by an LC circuit, said switch circuit is mainly constituted by a switching element and a transmission line, at least part of said transmission line of said LC circuit of said branching circuit and said switch circuit are constituted by said electrode patterns formed in said laminate, and chip elements constituting part of said switching element or said LC circuit are mounted onto said laminate.

17. The high-frequency module according to claim 10, wherein a coupler circuit is either connected between said high-frequency amplifier and said switch circuit or constituted in place of said switch circuit.

18. A communications device mounted with a high-frequency device according to claim 1.

19. A communications device mounted with a high-frequency module according to claim 10.

* * * * *